(12) United States Patent
Shionoya et al.

(10) Patent No.: US 10,841,512 B2
(45) Date of Patent: *Nov. 17, 2020

(54) ELECTRONIC APPARATUS, METHOD FOR CONTROLLING ELECTRONIC APPARATUS, AND CONTROL PROGRAM

(71) Applicant: NIKON CORPORATION, Tokyo (JP)

(72) Inventors: Takashi Shionoya, Tokyo (JP); Toshiyuki Kanbara, Tokyo (JP); Masakazu Sekiguchi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/177,653

(22) Filed: Nov. 1, 2018

(65) Prior Publication Data
US 2019/0089909 A1 Mar. 21, 2019

Related U.S. Application Data

(63) Continuation of application No. 14/900,802, filed as application No. PCT/JP2013/068381 on Jul. 4, 2013, now Pat. No. 10,142,563.

(51) Int. Cl.
*H04N 5/335* (2011.01)
*H04N 3/14* (2006.01)
*H04N 5/265* (2006.01)
*H04N 5/343* (2011.01)
*H04N 5/345* (2011.01)
(Continued)

(52) U.S. Cl.
CPC ....... *H04N 5/265* (2013.01); *H01L 27/14634* (2013.01); *H04N 5/23216* (2013.01); *H04N 5/2624* (2013.01); *H04N 5/343* (2013.01); *H04N 5/345* (2013.01);
(Continued)

(58) Field of Classification Search
CPC .... H04N 5/2355; H04N 5/2356; H04N 5/353; H04N 5/3535; H04N 5/355; H04N 5/35563
See application file for complete search history.

(56) References Cited

U.S. PATENT DOCUMENTS 6,529,640 B1 3/2003 Utagawa et al.
7,446,812 B2 11/2008 Ando et al.
(Continued)

FOREIGN PATENT DOCUMENTS

EP 2129108 A1 12/2009
EP 2833620 A1 2/2015
(Continued)

OTHER PUBLICATIONS

Oct. 1, 2013 International Search Report issued in International Patent Application No. PCT/JP2013/068381.
(Continued)

*Primary Examiner* — Kelly L Jerabek
(74) *Attorney, Agent, or Firm* — Oliff PLC

(57) ABSTRACT

To generate multiple types of images of the same subject, an electronic apparatus includes a drive control unit that controls the drive of an image sensor, a division unit that divides an image capture region of the image sensor into at least first and second regions, and an image generation unit that generates a first image by capturing an image of the same subject in the first region and generates a second image by capturing an image of the same subject in the second region.

56 Claims, 21 Drawing Sheets

(51) Int. Cl.
  *H04N 5/369* (2011.01)
  *H04N 5/355* (2011.01)
  *H01L 27/146* (2006.01)
  *H04N 5/232* (2006.01)
  *H04N 5/262* (2006.01)
  *H04N 5/378* (2011.01)

(52) U.S. Cl.
  CPC ......... *H04N 5/35554* (2013.01); *H04N 5/378* (2013.01); *H04N 5/379* (2018.08)

(56) References Cited

U.S. PATENT DOCUMENTS

| | | | |
|---|---|---|---|
| 8,508,639 | B2 | 8/2013 | Mabuchi et al. |
| 10,142,563 | B2 * | 11/2018 | Shionoya ........... H04N 5/35554 |
| 2004/0207734 | A1 | 10/2004 | Horiuchi |
| 2006/0250515 | A1 | 11/2006 | Koseki et al. |
| 2008/0284871 | A1 | 11/2008 | Kobayashi |
| 2009/0135263 | A1 | 5/2009 | Sorek et al. |
| 2009/0160947 | A1 | 6/2009 | Shigeta et al. |
| 2010/0002940 | A1 | 1/2010 | Aoki et al. |
| 2010/0007780 | A1 | 1/2010 | Nishihara |
| 2010/0231738 | A1 | 9/2010 | Border et al. |
| 2010/0276572 | A1 | 11/2010 | Iwabuchi et al. |
| 2011/0141331 | A1 | 6/2011 | Lee et al. |
| 2012/0057014 | A1 | 3/2012 | Takayama |
| 2013/0057740 | A1 | 3/2013 | Takaiwa |
| 2013/0113971 | A1 | 5/2013 | Okada et al. |
| 2013/0278802 | A1 | 10/2013 | Attar et al. |
| 2015/0015760 | A1 | 1/2015 | Tsunai |
| 2015/0077590 | A1 | 3/2015 | Kuriyama et al. |
| 2015/0381910 | A1 | 12/2015 | Kuriyama |
| 2017/0118422 | A1 | 4/2017 | Tsunai |
| 2018/0054577 | A1 | 2/2018 | Kuriyama |
| 2018/0227512 | A1 | 8/2018 | Tsunai |

FOREIGN PATENT DOCUMENTS

| | | |
|---|---|---|
| EP | 2975839 A1 | 1/2016 |
| JP | 2010-239277 A | 10/2010 |
| WO | 2007/134473 A1 | 11/2007 |

OTHER PUBLICATIONS

Jan. 5, 2016 International Preliminary Report on Patentability issued in International Patent Application No. PCT/JP2013/068381.
Oct. 27, 2016 Search Report issued in European Patent Application No. 13888636.1.
Mar. 1, 2017 Office Action Issued in U.S Appl. No. 14/900,802.
Oct. 10, 2017 Office Action issued in U.S Appl. No. 14/900,802.
Mar. 12, 2018 Office Action Issued in U.S Appl. No. 14/900,802.
Jul. 9, 2019 Office Action issued in Japanese Patent Application No. 2018-126520.
Sep. 5, 2017 Office Action issued in Japanese Patent Application No. 2015-524974.
Jan. 14, 2019 Office Action issued in European Patent Application No. 13888636.1.
Apr. 7, 2020 Office Action issued in Japanese Patent Application No. 2018-126520.
Sep. 24, 2019 Search Report issued in European Patent Application No. 19181971.3.
Sep. 25, 2019 Examination Report issued in Indian Patent Application No. 11748/DELNP/2015.
Aug. 25, 2020 Office Action issued in Chinese Patent Application No. 201811271609.7.

* cited by examiner

Fig. 16
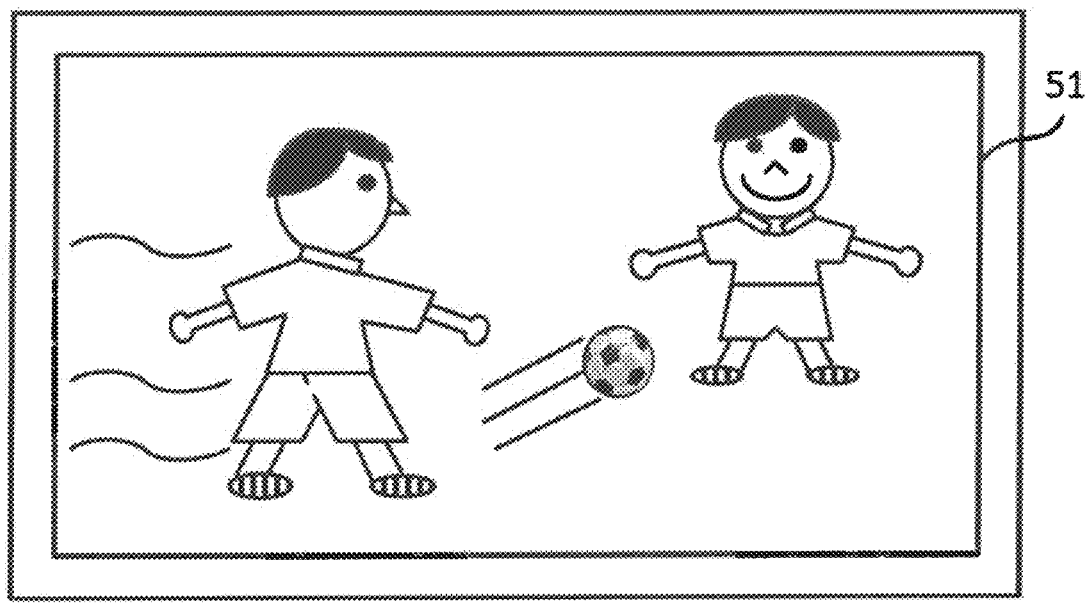
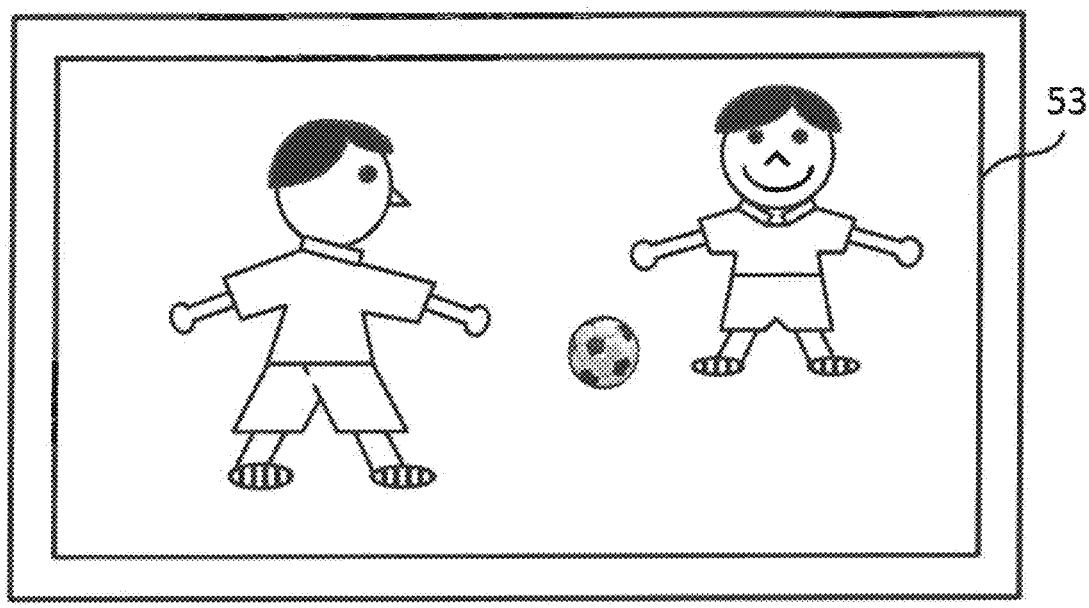

FIFTH BLOCK ARRANGEMENT PATTERN

SIXTH BLOCK ARRANGEMENT PATTERN

ELECTRONIC APPARATUS, METHOD FOR CONTROLLING ELECTRONIC APPARATUS, AND CONTROL PROGRAM

This application is a Continuation of application Ser. No. 14/900,802, filed Dec. 22, 2015, which is a national stage application of International Application No. PCT/JP2013/068381, filed Jul. 4, 2013. The entire contents of these prior applications are hereby incorporated by reference.

TECHNICAL FIELD

The present invention relates to an electronic apparatus, a method for controlling an electronic apparatus, and a control program.

BACKGROUND ART

Electronic apparatuses each including an image sensor in which a back-illuminated image-capture chip and a signal processing chip are stacked (hereafter referred to as a stacked image sensor) have been proposed (for example, see Patent Literature 1). In a stacked image sensor, a back-illuminated image capture chip and a signal processing chip are stacked so as to be connected via micro-bumps corresponding to blocks each including multiple pixels.

CITATION LIST

Patent Literature

[Patent Literature 1] Japanese Unexamined Patent Application Publication No. 2006-49361

SUMMARY OF INVENTION

Technical Problem

However, there have been proposed only a few electronic apparatuses including a stacked image sensor that captures images on a multiple-block basis. Accordingly, the usability of electronic apparatuses including a stacked image sensor has not been sufficiently improved.

An object of an aspect of the present invention is to generate multiple types of images of the same subject.

Solution to Problem

A first aspect of the present invention provides an electronic apparatus including a drive control unit configured to control drive of an image sensor, a division unit configured to divide an image capture region of the image sensor into at least first and second regions, and an image generation unit configured to generate a first image by capturing an image of an identical subject in the first region and to generate a second image by capturing an image of the identical subject in the second region.

A second aspect of the present invention provides a method for controlling an electronic apparatus including an image sensor. The method includes dividing an image capture region of the image sensor into at least first and second regions and generating a first image by capturing an image of an identical subject in the first region and generating a second image by capturing an image of the identical subject in the second region.

A third aspect of the present invention provides a control program for causing a control unit of an electronic apparatus including an image sensor to perform a division process of dividing an image capture region of an image sensor of the image capture unit into at least first and second regions and an image generation process of generating a first image by capturing an image of an identical subject in the first region and generating a second image by capturing an image of the identical subject in the second region.

Advantageous Effects of the Invention

According to the aspects of the present invention, multiple types of images of the same subject can be generated.

BRIEF DESCRIPTION OF THE DRAWINGS

FIG. 16 is a drawing showing an example display in which moving images are displayed on the first display unit and a still image is displayed on the second display unit.

EMBODIMENTS OF THE INVENTION

Hereafter, embodiments of the present invention will be described with reference to the drawings. However, the present invention is not limited thereto. To clarify the embodiments, the drawings are scaled as appropriate, for example, partially enlarged or highlighted.

First Embodiment

Figure 1:
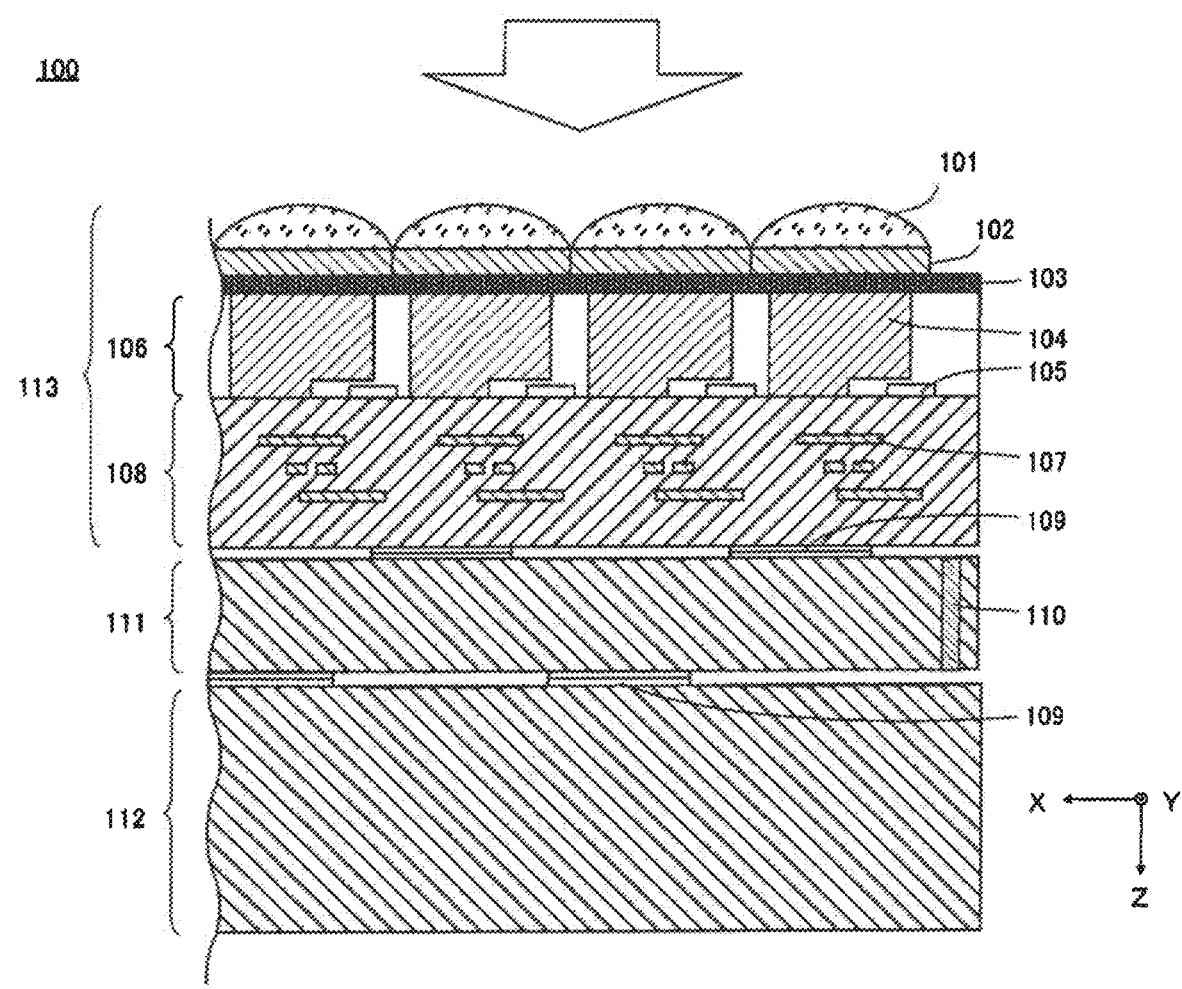
FIG. 1 is a sectional view of a stacked image sensor.

FIG. 1 is a sectional view of a stacked image sensor. A stacked image sensor 100 is disclosed in Japanese Patent Application No. 2012-139026 previously filed by the present applicant. The image sensor 100 includes an image-capture chip 113 configured to output a pixel signal corresponding to incident light, a signal processing chip 111 configured to process the pixel signal, and a memory chip 112 configured to store the pixel signal. The image-capture chip 113, signal processing chip 111, and memory chip 112 are stacked and electrically connected to one another via conductive bumps 109 such as Cu.

As shown in FIG. 1, incident light enters the image sensor 100 in a positive z-axis direction mainly shown by an outline arrow. In the present embodiment, the incident light entry surface of the image-capture chip 113 is referred to as a back surface. Further, as shown by coordinate axes, the direction which is perpendicular to the z-axis and oriented to the left side of the drawing is referred to as a positive x-axis direction, and the direction which is perpendicular to the z- and x-axes and oriented to the viewer is referred to as a positive y-axis direction. In the following some drawings, coordinate axes are shown using the coordinate axes of FIG. 1 as a reference so that the orientations of such drawings are understood.

One example of the image-capture chip 113 is a back-illuminated MOS image sensor. A PD layer 106 is disposed on the back surface of a wiring layer 108. The PD layer 106 includes multiple photodiodes (PDs) 104 disposed two-dimensionally and configured to accumulate charge corresponding to incident light and transistors 105 disposed in a manner corresponding to the PDs 104.

Color filters 102 are disposed over the incident light entry surface of the PD layer 106 with a passivation film 103 therebetween. The color filters 102 are each a filter which transmits a particular wavelength range of visible light. That is, the color filters 102 include multiple color filters which transmit different wavelength ranges and are arranged in a particular manner so as to correspond to the PDs 104. The arrangement of the color filters 102 will be described later. A set of a color filter 102, a PD 104, and a transistor 105 forms one pixel.

Microlenses 101 are disposed on the incident light entry sides of the color filters 102 in a manner corresponding to the pixels. The microlenses 101 condense incident light toward the corresponding PDs 104.

The wiring layer 108 includes lines 107 configured to transmit pixel signals from the PD layer 106 to the signal processing chip 111. The lines 107 may be multilayered and may include passive and active elements. Multiple bumps 109 are disposed on the front surface of the wiring layer 108 and aligned with multiple bumps 109 disposed on the opposite surface of the signal processing chip ill. The aligned bumps 109 are bonded together and electrically connected together, for example, by pressurizing the image-capture chip 113 and signal processing chip 111.

Similarly, multiple bumps 109 are disposed on the opposite surfaces of the signal processing chip 111 and memory chip 112 and aligned with each other. The aligned bumps 109 are bonded together and electrically connected together, for example, by pressurizing the signal processing chip 111 and memory chip 112.

The methods for bonding the bumps 109 together include Cu bump bonding using solid phase diffusion, as well as micro-bump bonding using solder melting. For the bumps 109, it is only necessary to provide, for example, one bump or so with respect to one unit group (to be discussed later). Accordingly, the size of the bumps 109 may be larger than the pitch between the PDs 104. Further, bumps which are larger than the bumps 109 corresponding to a pixel region having the pixels arranged therein (a pixel region 113A shown in FIG. 2) may be additionally provided in peripheral regions other than the pixel region.

The signal processing chip 111 includes a through-silicon via (TSV) 110 configured to connect together circuits disposed on the front and back surfaces thereof. The TSV 110 is disposed in a peripheral region. Alternatively, the TSV 110 may be disposed in a peripheral region of the image-capture chip 113 or in the memory chip 112.

Figure 2:
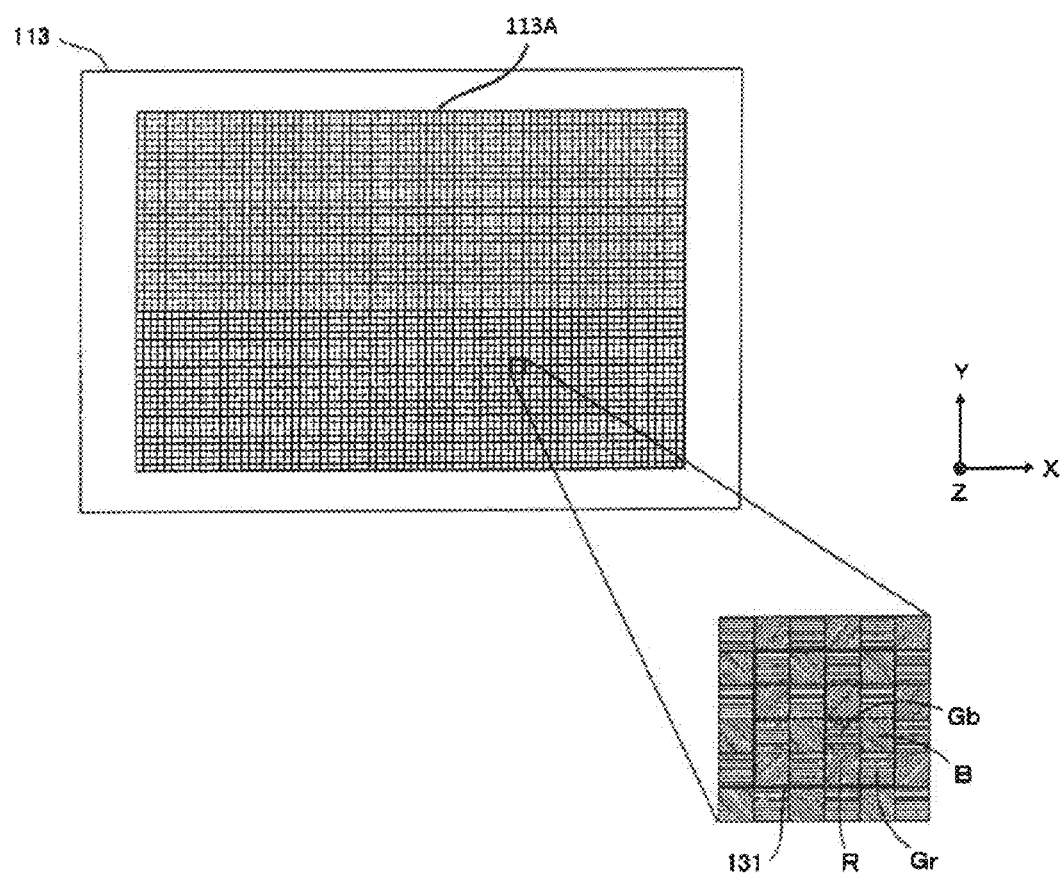
FIG. 2 is a diagram showing the pixel array of an image capture chip and a unit group.

FIG. 2 is a diagram showing the pixel array of the image-capture chip and a unit group. In FIG. 2, the image-capture chip 113 is observed from the back side. The pixel region 113A is the pixel-arranged region of the image-capture chip 113. In the pixel region 113A, 20 million or more pixels are arranged in a matrix. In an example shown in FIG. 2, four adjacent pixels×four adjacent pixels, that is, 16 pixels form one unit group 131. Grid lines in FIG. 2 show a concept that adjacent pixels are grouped into unit groups 131. The number of pixels forming the unit groups 131 is not limited to that described above and may be on the order of 1000, for example, 32 pixels×64 pixels, or may be 1000 or more or less than 1000.

As shown in a partial enlarged view of the pixel region 113A, one unit group 131 includes four so-called Bayer arrays which each includes four pixels, that is, green pixels Gb, Gr, a blue pixel B, and a red pixel R and which are arranged vertically and horizontally. The green pixels are each a pixel having a green filter as a color filter 102 and receive light in the green wavelength band of incident light. Similarly, the blue pixel is a pixel having a blue filter as a color filter 102 and receives light in the blue wavelength band. The red pixel is a pixel having a red filter as a color filter 102 and receives light in the red wavelength band.

Figure 3:
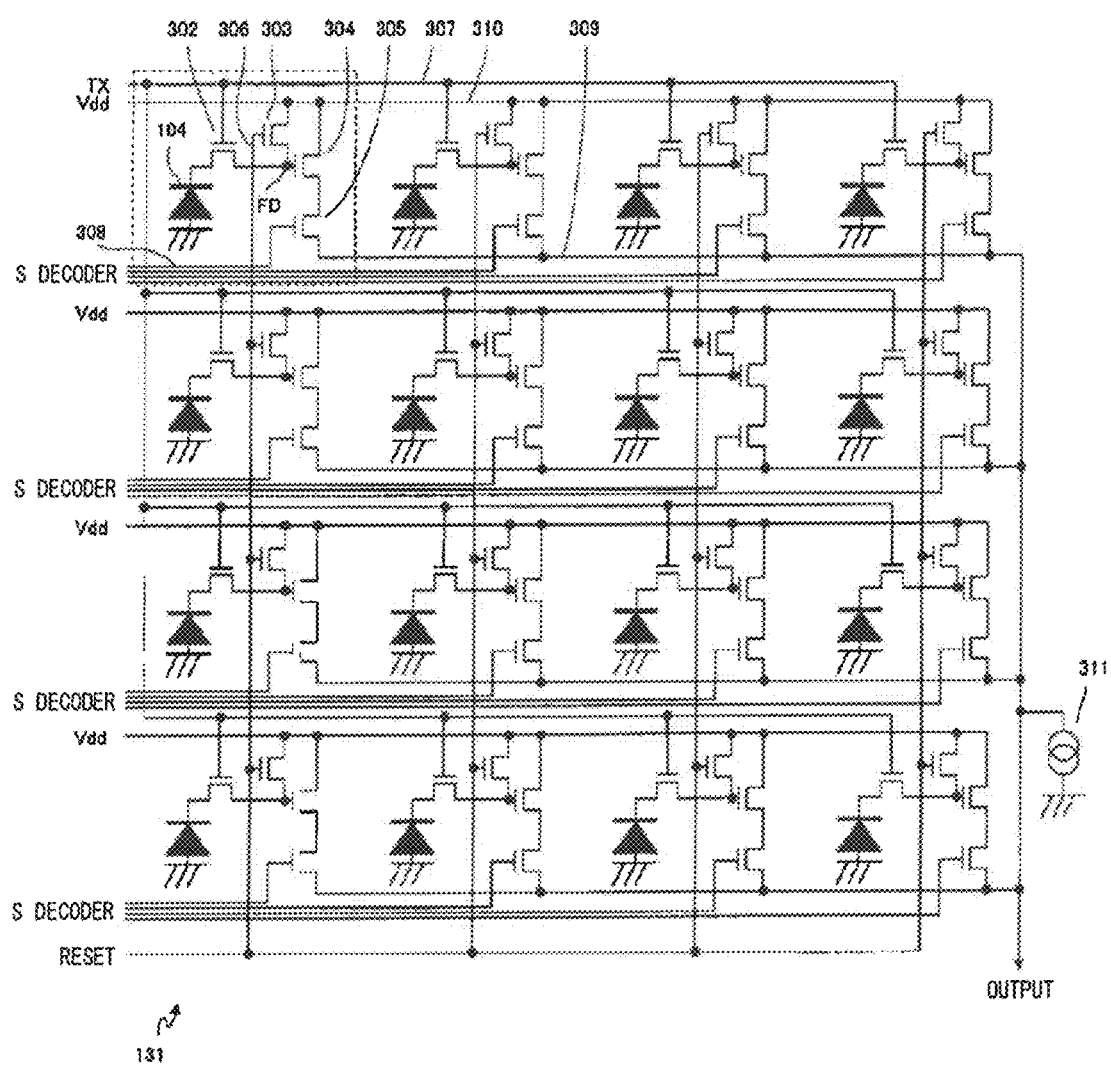
FIG. 3 is a circuit diagram of a unit group of the image capture chip.

FIG. 3 is a circuit diagram of a unit group of the image-capture chip. In FIG. 3, a rectangle surrounded by a dotted line as a representative shows the circuit of one pixel. At least part of each transistor described below corresponds to one transistor 105 in FIG. 1.

As described above, one unit group 131 includes 16 pixels. Sixteen PDs 104 included in these pixels are connected to corresponding transfer transistors 302. The gates of the transfer transistors 302 are connected to a TX line 307 through which a transfer pulse is supplied. In the present embodiment, the TX line 307 is shared by the 16 transfer transistors 302.

The drain of each transfer transistor 302 is connected to the source of a corresponding reset transistor 303, and so-called floating diffusion FD (charge detection unit) therebetween is connected to the gate of a corresponding amplifier transistor 304. The drains of the reset transistors 303 are connected to a Vdd line 310 through which a power-supply voltage is supplied. The gates of the reset transistors 303 are connected to a reset line 306 through which a reset pulse is supplied. In the present embodiment, the reset line 306 is shared by the 16 reset transistors 303.

The drains of the amplifier transistors 304 are connected to the Vdd line 310, through which a power-supply voltage is supplied. The sources of the amplifier transistors 304 are connected to the drains of corresponding select transistors 305. The gates of the select transistors 305 are connected to corresponding decoder lines 308 through which a selection pulse is supplied. In the present embodiment, the different decoder lines 308 are disposed with respect to the 16 select transistors 305. The sources of the select transistors 305 are connected to a shared output line 309. A load current source 311 supplies a current to the output line 309. That is, the output line 309 with respect to the select transistors 305 is formed by a source follower. The load current source 311 may be disposed in any of the image-capture chip 113 and signal processing chip 111.

Described below is the flow from when the accumulation of charge starts to when pixel signals are outputted after the accumulation ends. Reset pulses are applied to the reset transistors 303 through the reset line 306. Simultaneously, transfer pulses are applied to the transfer transistors 302 through the TX line 307. Thus, the potentials of the PDs 104 and floating diffusion FD are reset.

When the application of the transfer pulses is released, the PDs 104 convert received incident light into charge and accumulate it. Subsequently, when transfer pulses are applied again with reset pulses not being applied, the charge accumulated in each PD 104 is transferred to the corresponding floating diffusion FD. Thus, the potential of the floating diffusion FD is changed from the reset potential to the signal potential after the charge accumulation. When selection pulses are applied to the select transistors 305 through the decoder lines 308, the variation in the signal potential of each floating diffusion FD is transmitted to the output line 309 through the corresponding amplifier transistor 304 and select transistor 305. Based on such a circuit operation, the unit pixels output, to the output line 309, pixel signals corresponding to the reset potentials and pixel signals corresponding to the signal potentials.

As shown in FIG. 3, in the present embodiment, the reset line 306 and TX line 307 are shared by the 16 pixels forming the unit group 131. That is, reset pulses and transfer pulses are simultaneously applied to all the 16 pixels. Accordingly, all the pixels forming the unit group 131 start to accumulate charge at the same timing and end the charge accumulation at the same timing. Note that selection pulses are sequentially applied to the select transistors 305 and therefore pixel signals corresponding to the accumulated charge are selectively outputted to the output line 309. Different reset lines 306, TX lines 307, and output lines 309 are disposed for the respective unit groups 131.

By constructing the circuit on the basis of unit groups 131 as described above, the charge accumulation time can be controlled for each unit group 131. In other words, it is possible to cause the unit groups 131 to output pixel signals based on different charge accumulation times. More specifically, by causing another unit group 131 to accumulate charge several times and to output pixel signals each time while one unit group 131 is caused to accumulate charge once, it is possible to cause the unit groups 131 to output moving image frames at different frame rates.

Figure 4:
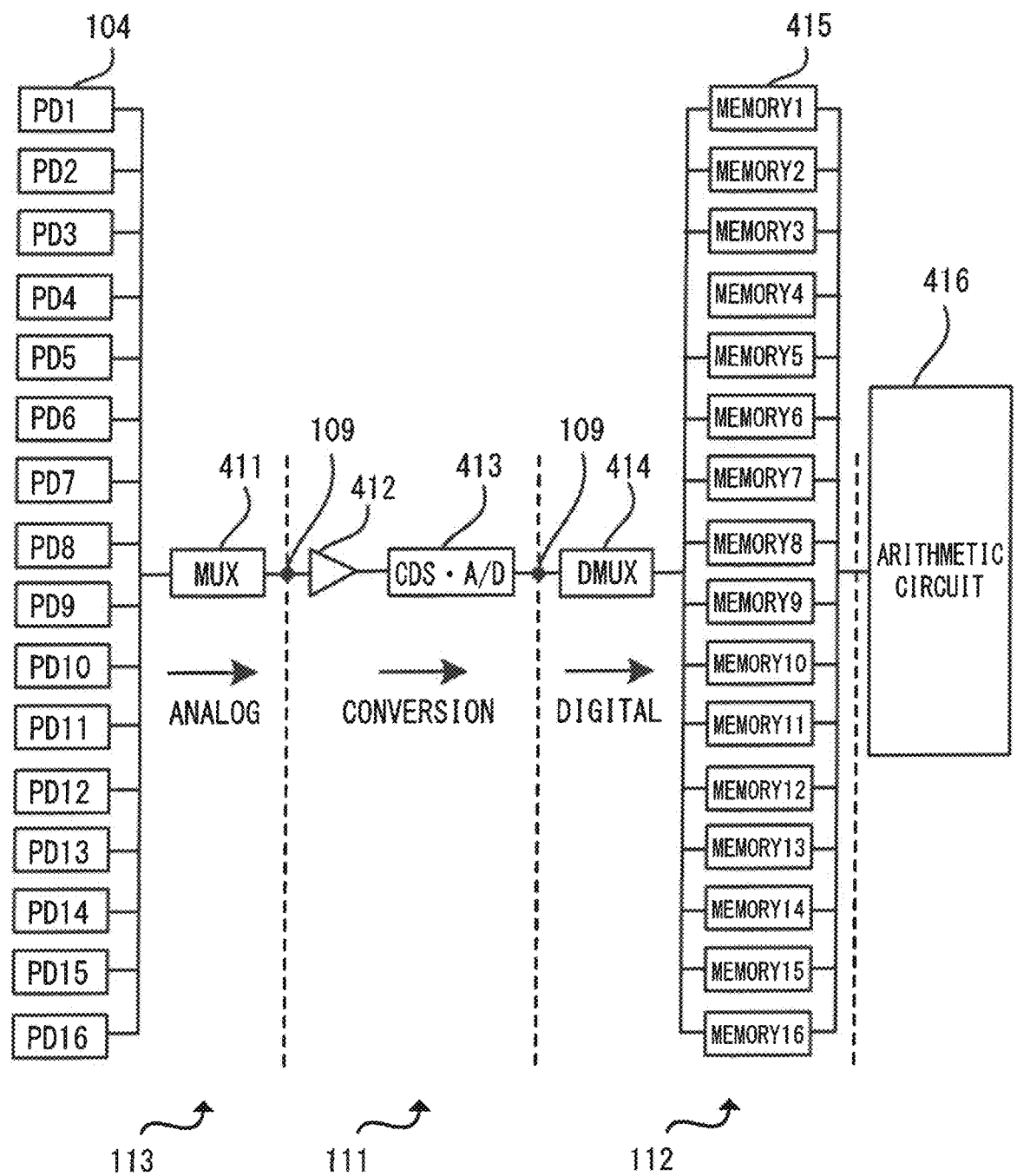
FIG. 4 is a block diagram showing the functional configuration of an image sensor.

FIG. 4 is a block diagram showing the functional configuration of the image sensor. An analog multiplexer 411 sequentially selects 16 PDs 104 forming one unit group 131 and causes each selected PD 104 to output a pixel signal to an output line 309 disposed in a manner corresponding to the unit group 131. The multiplexer 411 is formed along with the PDs 104 in the image-capture chip 113.

The analog pixel signals outputted through the multiplexer 411 are amplified by an amplifier 412 which is formed in the signal processing chip 111. The pixel signals amplified by the amplifier 412 are subjected to correlated double sampling (CDS) and analog-to-digital (A/D) conversion by a signal processing circuit 413 formed in the signal processing chip 111 and configured to perform CDS and A/D conversion. Since the pixel signals are subjected to CDS by the signal processing circuit 413, the noise in the pixel signals is reduced. The A/D-converted pixel signals are passed to a demultiplexer 414 and then stored in corresponding pixel memories 415. The demultiplexer 414 and pixel memories 415 are formed in the memory chip 112.

An arithmetic circuit 416 processes the pixel signals stored in the pixel memories 415 and passes the resulting signals to a subsequent image processing unit. The arithmetic circuit 416 may be disposed in any of the signal processing chip 111 and memory chip 112. While the elements connected to the single unit group 131 are shown in FIG. 4, these elements are disposed for each unit group 131 in practice and operate in parallel. Note that the arithmetic circuit 416 need not necessarily be disposed for each unit group 131. For example, a single arithmetic circuit 416 may sequentially refer to and process the values in the pixel memories 415 corresponding to the respective unit groups 131.

As described above, the output lines 309 are disposed in a manner corresponding to the respective unit groups 131. In the image sensor 100, the image-capture chip 113, signal processing chip 111, and memory chip 112 are stacked. Accordingly, by using, as the output lines 309, the bumps 109 electrically connecting between the chips, the lines can be routed without enlarging the chips in the surface direction.

Next, blocks set in the pixel region 113A (see FIG. 2) of the image sensor 100 will be described. In the present embodiment, the pixel region 113A of the image sensor 100 is divided into multiple blocks. Each block includes at least one unit group 131. Pixels included in the respective blocks are controlled by different control parameters. That is, the control parameter varies between pixel signals acquired from pixels included in one block and pixel signals acquired from pixels included in another block. Examples of a control parameter include the charge accumulation time or frequency, the frame rate, the gain, the thinning-out rate, the number of rows or columns whose pixel signals are summed up, and the digitized bit number. The control parameters may be parameters used in image processing following the acquisition of image signals from the pixels.

As used herein, the charge accumulation time refers to the time from when the PDs 104 start to accumulate charge to when they end the accumulation. The charge accumulation frequency refers to the frequency with which the PDs 104 accumulate charge per unit time. The frame rate refers to the number of frames processed (displayed or recorded) per unit time in a moving image. The frame rate is expressed in frames per second (fps). As the frame rate is increased, a subject (i.e., subjects whose images are to be captured) moves more smoothly in a moving image.

The gain refers to the gain factor (amplification factor) of the amplifier 412. By changing the gain, the ISO sensitivity can be changed. The ISO sensitivity is a standard for photographic films developed by the ISO and represents the level of the weakest light which a photographic film can record. Typically, the sensitivity of image sensors is represented by the ISO sensitivity. In this case, the ability of the image sensor 100 to capture light is represented by the value of the ISO sensitivity. When the gain is increased, the ISO sensitivity is increased as well. For example, when the gain is doubled, the electrical signal (pixel signal) is doubled as well. Thus, appropriate brightness is obtained even when the amount of incident light is halved. However, the increase in gain amplifies noise included in the electric signal, thereby increasing noise.

The thinning-out rate refers to the ratio of the number of pixels from which pixel signals are not read to the total number of pixels in a predetermined region. For example, a thinning-out rate of a predetermined region of 0 means that pixel signals are read from all pixels in the predetermined region. A thinning-out rate of a predetermined region of 0.5 means that pixel signals are read from half the pixels in the predetermined region. Specifically, where a unit group 131 is a Bayer array, one Bayer array unit from which pixel signals are read and one Bayer array unit from which pixel signals are not read are alternately set in the vertical direction, that is, two pixels (two rows) from which pixel signals are read and two pixels (two rows) from which pixel signals are not read are alternately set in the vertical direction. On the other hand, when the pixels from which pixel signals are read are thinned out, the resolution of images is reduced. However, 20 million or more pixels are arranged in the image sensor 100 and therefore, even when the pixels are thinned out, for example, at a thinning-out rate of 0.5, images can be displayed with 10 million or more pixels. For this reason, the user (operator) seems not to worry about such a resolution reduction.

The number of rows whose pixel signals are summed up refers to the number of vertically adjacent pixels whose pixel signals are summed up. The number of columns whose pixel signals are summed up refers to the number of horizontally adjacent pixels whose pixel signals are summed up. Such a summation process is performed, for example, in the arithmetic circuit 416. When the arithmetic circuit 416 sums up pixel signals of a predetermined number of vertically or horizontally adjacent pixels, there is obtained an effect similar to that obtained by thinning out the pixels at a predetermined thinning-out rate and reading pixel signals from the resulting pixels. In the summation process, an average value may be calculated by dividing the sum of the pixel signals by the row number or column number obtained by the arithmetic circuit 416.

The digitized bit number refers to the number of bits of a digital signal converted from an analog signal by the signal processing circuit 413. As the number of bits of a digital signal is increased, luminance, color change, or the like is represented in more detail.

In the present embodiment, the accumulation conditions refer to the conditions on the accumulation of charge in the image sensor 100. Specifically, the accumulation conditions refer to the charge accumulation time or frequency, frame rate, and gain of the control parameters. Since the frame rate can change according to the charge accumulation time or frequency, it is included in the accumulation conditions. Similarly, the correct amount of exposure can change according to the gain, and the charge accumulation time or frequency can change according to the correct amount of exposure. Accordingly, the gain is included in the accumulation conditions.

The image-capture conditions refer to conditions on image-capture of a subject. Specifically, the image-capture conditions refer to control parameters including the accumulation conditions. The image-capture conditions includes control parameters for controlling the image sensor 100 (e.g., the charge accumulation time or frequency, frame rate, gain), as well as control parameters for controlling reading of signals from the image sensor 100 (e.g., thinning-out rate), and control parameters for processing signals from the image sensor 100 (e.g., the number of rows or columns whose pixel signals are summed up, digitized bit number, and control parameters used when an image processing unit 30 (to be discussed later) processes images).

Figure 5:
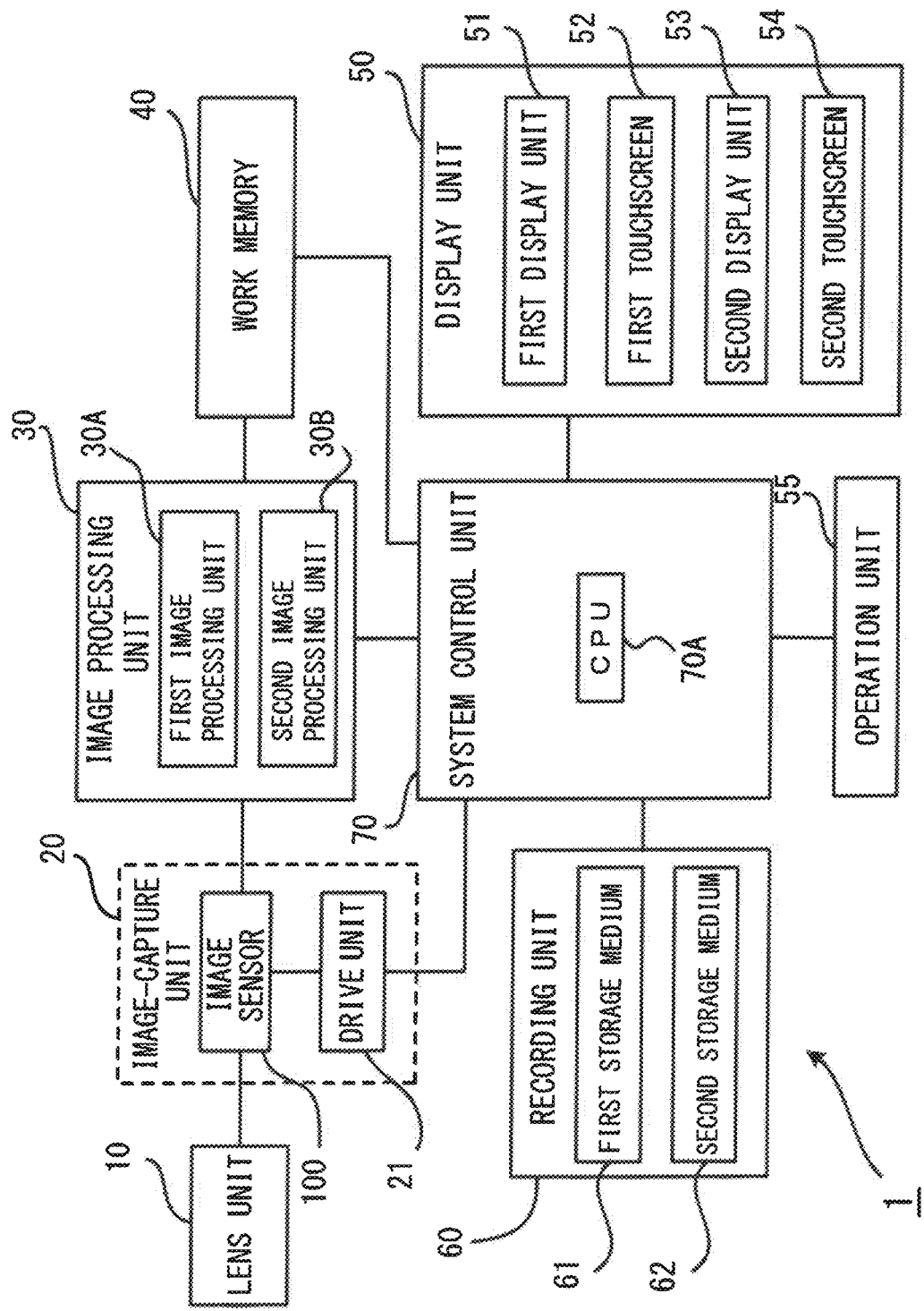
FIG. 5 is a block diagram showing the configuration of an electronic apparatus according to a first embodiment.

FIG. 5 is a block diagram showing the configuration of an electronic apparatus according to the first embodiment. The electronic apparatus 1 shown in FIG. 5 includes digital cameras, smartphones, mobile phones, and personal computers which each have an image capture function. As shown in FIG. 5, an electronic apparatus 1 includes a lens unit 10, an image-capture unit 20, the image processing unit 30, a work memory 40, a display unit 50, an operation unit 55, a recording unit 60, and a system control unit 70. The lens unit 10 is an image-capture optical system including multiple lenses. The lens unit 10 guides a pencil of rays from a subject to the image-capture unit 20. The lens unit 10 may be integral with the electronic apparatus 1 or may be an interchangeable lens which is detachable from the electronic apparatus 1. The lens unit 10 may also include a focus lens or zoom lens.

The image-capture unit 20 includes the image sensor 100 and a drive unit 21. The drive unit 21 is a control circuit configured to control the drive of the image sensor 100 in accordance with an instruction from the system control unit 70. Specifically, the drive unit 21 controls the charge accumulation time or frequency, which is a control parameter, by controlling the timing (or the cycle of the timing) when reset pulses or transfer pulses are applied to the reset transistors 303 or transfer transistors 302, respectively. The drive unit 21 also controls the frame rate by controlling the timing (or the cycle of timing) when reset pulses, transfer pulses, or selection pulses are applied to the reset transistors 303, transfer transistor 302, or select transistors 305, respectively. The drive unit 21 also controls the thinning-out rate by setting pixels to which reset pulses, transfer pulses, and selection pulses are applied.

The drive unit 21 also controls the ISO sensitivity of the image sensor 100 by controlling the gain (also called the gain factor or amplification factor) of the amplifier 412. The drive unit 21 also sets the number of rows or columns whose pixel signals are summed up by transmitting an instruction to the arithmetic circuit 416. The drive unit 21 also sets the digitized bit number by transmitting an instruction to the signal processing circuit 413. The drive unit 21 also sets blocks in the pixel region (image-capture region) 113A of the image sensor 100. As seen above, the drive unit 21 serves as an image sensor control unit that causes the image sensor 100 to capture an image under image-capture conditions which vary among the blocks and then to output pixel signals. The system control unit 70 transmits an instruction about the position, shape, range, or the like of blocks to the drive unit 21.

The image sensor 100 passes the pixel signals from the image sensor 100 to the image processing unit 30. The image processing unit 30 generates image data by performing various types of image processing on raw data composed of the pixel signals of the pixels using the work memory 40 as work space. The image processing unit 30 includes a first image processing unit 30A and a second image processing unit 30B. When the load of image processing is high, the processing is distributed to the first image processing unit 30A and second image processing unit 30B. The first image processing unit 30A and second image processing unit 30B then perform the distributed processing in parallel.

In the present embodiment, as will be described later, the system control unit 70 (specifically, a division unit 71 shown in FIG. 7) divides the pixel region (image capture region) 113A of the image sensor 100 into at least first and second regions. The system control unit 70 (specifically, a drive control unit 72 shown in FIG. 7) also controls the drive of the image sensor 100 so that the image sensor 100 captures images in the first and second regions on different image capture conditions. In this case, for example, the first image processing unit 30A performs image processing on signals from the first region, and the second image processing unit 30B performs image processing on signals from the second region. Note that the pixel region (image capture region) 113A of the image sensor 100 need not be divided into the two regions composed of the first and second regions and may be divided into multiple regions composed of a first region, a second region, a third region, and the like. In this case, image processing with respect to the multiple regions is distributed to the first image processing unit 30A and second image processing unit 30B as appropriate. The distribution of image processing may be previously determined on the basis of the number of regions obtained by division, the ranges of the regions, or the like. The system control unit 70 may determine the distribution on the basis of the number of regions obtained by division, the ranges of the regions, or the like.

The image processing unit 30 performs various types of image processing. For example, the image processing unit 30 performs color signal processing (tone correction) on signals obtained from a Bayer array so as to generate RGB image signals. The image processing unit 30 then performs image processing such as white balance adjustment, sharpness adjustment, gamma correction, gradation adjustment, or the like on the RGB image signals. The image processing unit 30 compresses the resulting signals in a predetermined compression format (JPEG format, MPEG format, or the like), if necessary. The image processing unit 30 then outputs the resulting image data to the recording unit 60. The image processing unit 30 also outputs the image data to the display unit 50.

In the present embodiment, the image processing unit 30 performs the above processes, as well as detects a main subject from the image data. As used herein, the term "main subject" refers to a subject which is noted or assumed to be noted by the user (operator), of subjects whose images are to be captured. The number of main subjects in the image data is not limited to one, and multiple main subjects may be present (for example, see FIG. 14).

Parameters referred to when the image processing unit 30 performs image processing are also included in the control parameters (image capture conditions). For example, parameters such as color signal processing (tone correction), white balance adjustment, gradation adjustment, and compressibility are included in the control parameters. The signals read from the image sensor 100 vary with the charge accumulation time or the like, and the parameters referred to when image processing is performed also vary with the variations in the signals. The image processing unit 30 sets different control parameters for the respective blocks and performs image processing such as color signal processing on the basis of the control parameters.

The image processing unit 30 extracts or discards frames corresponding to predetermined timings from multiple frames chronologically obtained from the image capture unit 20. Thus, it is possible to reduce the amount of data to reduce the load on subsequent processes. The image processing unit 30 also calculates one or more frames to be interpolated between multiple frames chronologically obtained from the image capture unit 20 and then interpolates the calculated one or more frames between the multiple frames. Thus, it is possible to play back moving images in such a manner that the images move more smoothly. While the drive unit 21 is configured to control the thinning-out rate, other configurations may be employed. For example, the image processing unit 30 or arithmetic circuit 416 may control the thinning-out rate by discarding predetermined pixel signals of pixel signals read from all the pixels by the drive unit 21.

The work memory 40 temporarily stores image data or the like when the image processing unit 30 performs image processing. The display unit 50 is, for example, a liquid crystal display panel. As shown in FIG. 5, the display unit 50 includes a first display unit 51, a first touchscreen 52, a second display unit 53, and a second touchscreen 54.

The first display unit 51 displays images (still images, moving images, live view images) captured by the image capture unit 20, or various types of information. The first touchscreen 52 is formed on the display screen of the first display unit 51. When the user touches the first touchscreen 52, for example, to select an image [a thumbnail image (to be discussed later); see FIG. 13], the first touchscreen 52 outputs a signal indicating the touched position to the system control unit 70. The second display unit 53 displays images (still images, moving images, live view images) captured by the image capture unit 20, or various types of information. The second touchscreen 54 is formed on the display screen of the second display unit 53. When the user touches the second touchscreen 54, for example, to select an image, the second touchscreen 54 outputs a signal indicating the touched position to the system control unit 70.

The operation unit 55 includes a release switch, a moving image switch, and other types of operation switches operated by the user. The operation unit 55 outputs a signal corresponding to an operation performed by the user to the system control unit 70. The recording unit 60 has two card slots into which two storage media (first storage medium 61, second storage medium 62) such as memory cards can be inserted. The recording unit 60 stores image data generated by the image processing unit 30 or various types of data in the storage media (first storage medium 61, second storage medium 62) inserted in the card slots. In the present embodiment, as described above, the first image processing unit 30A and second image processing unit 30B perform image processing on signals from the first region and signals from the second region, respectively, in parallel. At this time, the first storage medium 61 stores image data based on the signals from the first region in accordance with an operation of the release switch or moving image switch. Similarly, the second storage medium 62 stores image data based on the signals from the second region in accordance with an operation of the release switch or moving image switch. The recording unit 60 also includes an internal memory. The recording unit 60 may record the image data generated by the image processing unit 30 or various types of data in the internal memory.

The system control unit 70 controls the entire processing and operation of the electronic apparatus 1. The system control unit 70 includes a central processing unit (CPU) 70A. In the present embodiment, the system control unit 70 divides the image capture surface (pixel region 113A) of the image sensor 100 into multiple blocks and causes the image sensor 100 to capture images in the blocks with different charge accumulation times (or charge accumulation frequencies), different frame rates, and/or different gains. For this reason, the system control unit 70 transmits, to the drive unit 21, the positions, shapes, and ranges of the blocks and accumulation conditions for the blocks. The system control unit 70 also causes the image sensor 100 to capture images in the blocks with different thinning-out rates, the different numbers of rows or columns whose pixel signals are summed up, and/or different digitized bit numbers. For this reason, the system control unit 70 transmits, to the drive unit 21, the image capture conditions (thinning-out rates, the numbers of rows or columns whose pixel signals are summed up, and digitized bit numbers) for the blocks. The image processing unit 30 performs image processing on image capture conditions (control parameters such as color signal processing, white balance adjustment, gradation adjustment, and compressibility) which vary among the blocks. For this reason, the image processing unit 70 transmits, to the image processing unit 30, the image capture conditions (control parameters such as color signal processing, white balance adjustment, gradation adjustment, and compressibility) for the blocks.

The system control unit 70 records the image data generated by the image processing unit 30 in the recording unit 60. The system control unit 70 also outputs the image data generated by the image processing unit 30 to the display unit 50 so as to display images on the display unit 50 (one or both of the first display unit 51 and touchscreen 52). The system control unit 70 also reads image data recorded in the recording unit 60 and outputs it to the display unit 50 so as to display images on the display unit 50 (one or both of the first display unit 51 and touchscreen 52). The images displayed on the first display unit 51 are still images, moving images, or live view images. As used herein, the term "live view images" refer to images displayed on the display unit 50 on the basis of image data sequentially generated and outputted by the image processing unit 30. The user uses live view images to check images of the subject being captured by the image capture unit 20. Live view images are also called through images or preview images.

Figure 6:
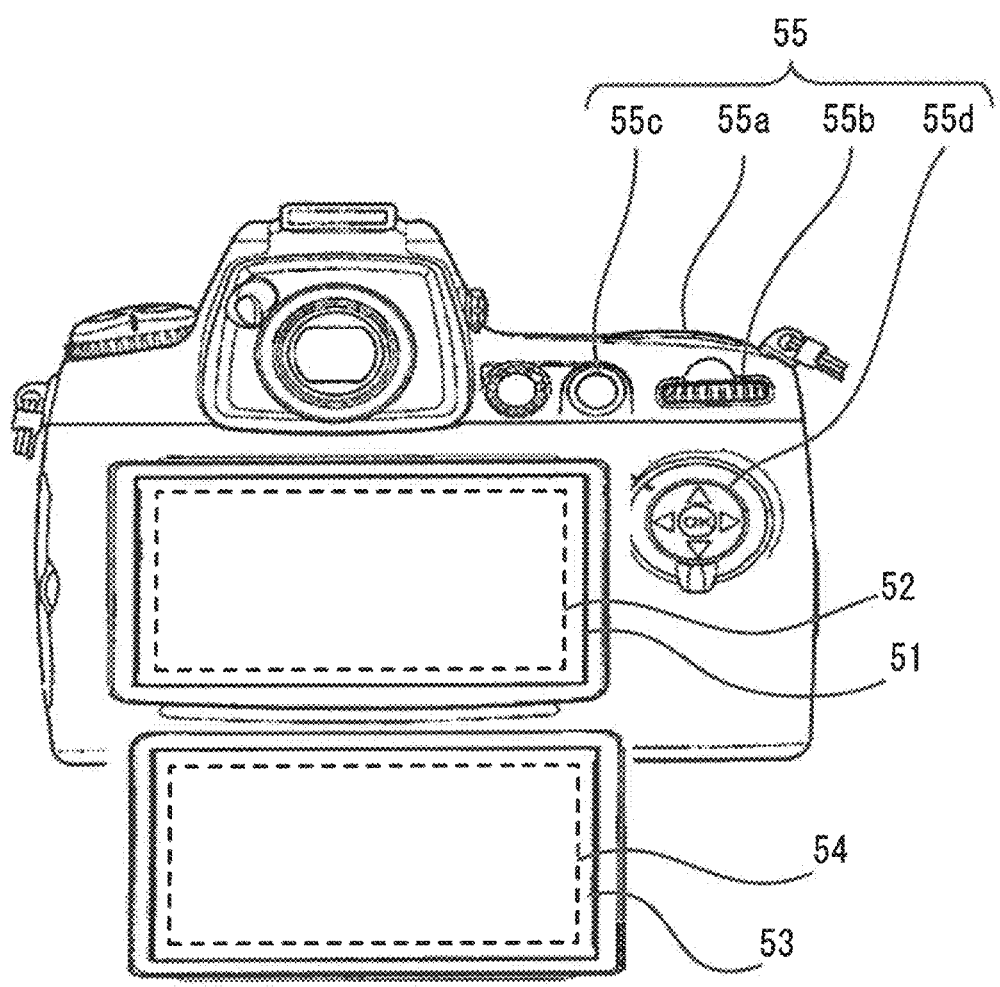
FIG. 6 is a drawing showing an appearance of a digital camera which is an example of an electronic apparatus.

FIG. 6 is a drawing showing an appearance of a digital camera which is an example of an electronic apparatus. FIG. 6 shows an appearance of the electronic apparatus (digital camera) 1 seen from the back. As shown in FIG. 6, the first display unit 51 is a display panel having a rectangular display screen. The first display unit 51 is disposed on the back of the electronic apparatus 1. The first touchscreen 52 is formed on the display screen of the first display unit 51.

The second display unit 53 is a display panel having a rectangular display screen. An edge of the second display unit 53 is rotatably coupled to the first display unit 51 through a hinge (not shown) disposed on the back of the electronic apparatus 1 and under the first display unit 51. When the second display unit 53 is rotated using the hinge as a pivot, the first display unit 51 is opened or closed by the second display unit 53.

The electronic apparatus 1 has a release switch 55a, a mode dial 55b, and a moving image switch 55c on the upper surface thereof. The release switch 55a is a switch that the user presses to capture a still image. A shooting preparation such as automatic focusing (AF) or automatic exposure (AE) is made by pressing the release switch 55a halfway. The mode dial 55b is a dial that the user rotates to set a scene mode such as portrait, landscape, or nightscape. The moving image switch 55c is a switch that the user presses to capture moving images. Further, a multi-selector 55d is disposed on the back of the electronic apparatus 1 and on a side of the first display unit 51. The multi-selector 55d includes upper, lower, left, and right arrow keys and OK switch that the user uses to make a selection in a menu (a menu for setting the image capture mode) displayed on the first display unit 51 or second display unit 53. The operation unit 55 includes the release switch 55a, mode dial 55b, moving image switch 55c, and multi-selector 55d. The operation unit 55 may further include other switches or the like.

Figure 7:
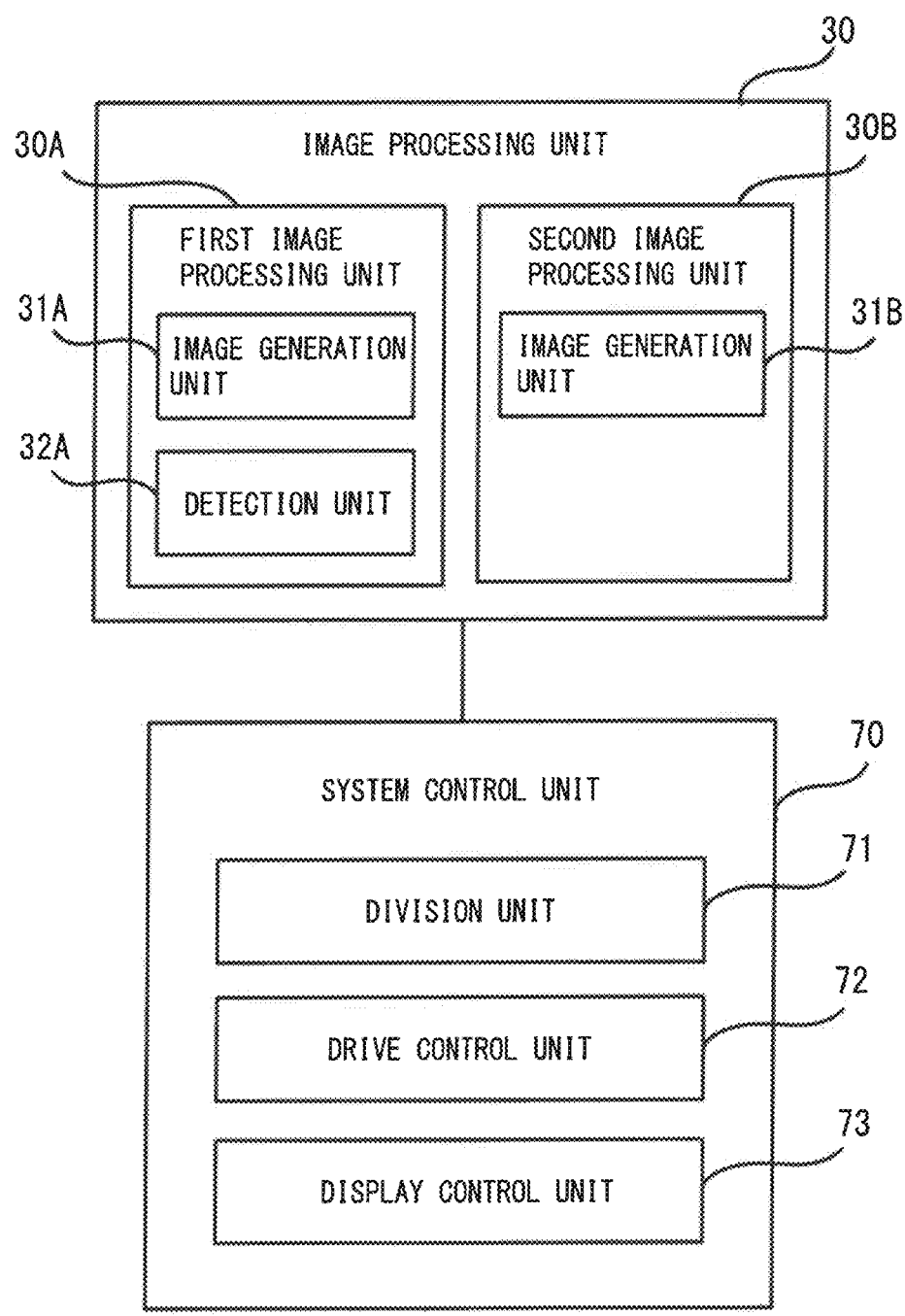
FIG. 7 is a function block diagram of an image processing unit and a system control unit.

FIG. 7 is a function block diagram of the image processing unit and system control unit shown in FIG. 5. As shown in FIG. 7, the first image processing unit 30A includes an image generation unit 31A and a detection unit 32A. The image generation unit 31A generates image data by performing various types of image processing on RAW data outputted from the image capture unit 20. The RAW data is composed of the pixel signals from the pixels in the first region. The detection unit 32A detects a main subject from the image data generated by the image generation unit 31A. In the present embodiment, the detection unit 32A makes a comparison among multiple pieces of image data chronologically obtained from live view images generated by the image generation unit 31A and detects a moving subject as a main subject. The detection unit 32A also detects a main subject using, for example, a face detection function as described in Japanese Unexamined Patent Application Publication No. 2010-16621 (US 2010/0002940). In addition to face detection, the detection unit 32A also detects a human body included in image data as a main subject, as described in Japanese Unexamined Patent Application Publication No. 2010-16621 (US 2010/0002940).

The second image processing unit 30B includes an image generation unit 31B. The image generation unit 31B generates image data by performing various types of image processing on RAW data outputted from the image capture unit 20. The RAW data is composed of the pixel signals from the pixels in the second region. While the second image processing unit 30B does not include a detection unit, it may include a detection unit. There may be employed a configuration in which the first image processing unit 30A does not include the detection unit 32A and the second image processing unit 30B includes a detection unit. In the present embodiment, the image generation unit 31A and image generation unit 31B may be collectively referred to as an image generation unit 31.

The system control unit 70 includes a division unit 71, a drive control unit 72, and a display control unit 73. The division unit 71 divides the pixel region (image capture region) 113A of the image sensor 100 into multiple regions on a block basis. The division unit 71 divides the pixel region 113A into multiple regions on the basis of a predetermined block arrangement pattern of the pixel region 113A [see FIGS. 8(A) to 8(D)]. The drive control unit 72 sets image capture conditions for the multiple regions. The drive control unit 72 also controls the drive of the image sensor 100 in response to the user operating the release switch 55a or moving image switch 55c. Even during capture of live view images (that is, after starting an image capture operation following power-on), the drive control unit 72 controls the drive of the image sensor 100. The display control unit 73 outputs the image data generated by the image generation unit 31 to the display unit 50 so as to display images (still images, moving images, live view images) on one or both of the first display unit 51 and second display unit 53.

The division unit 71, drive control unit 72, and display control unit 73 of the system control unit 70 are implemented when the CPU 70A performs processing on the basis of a control program.

Figure 8:
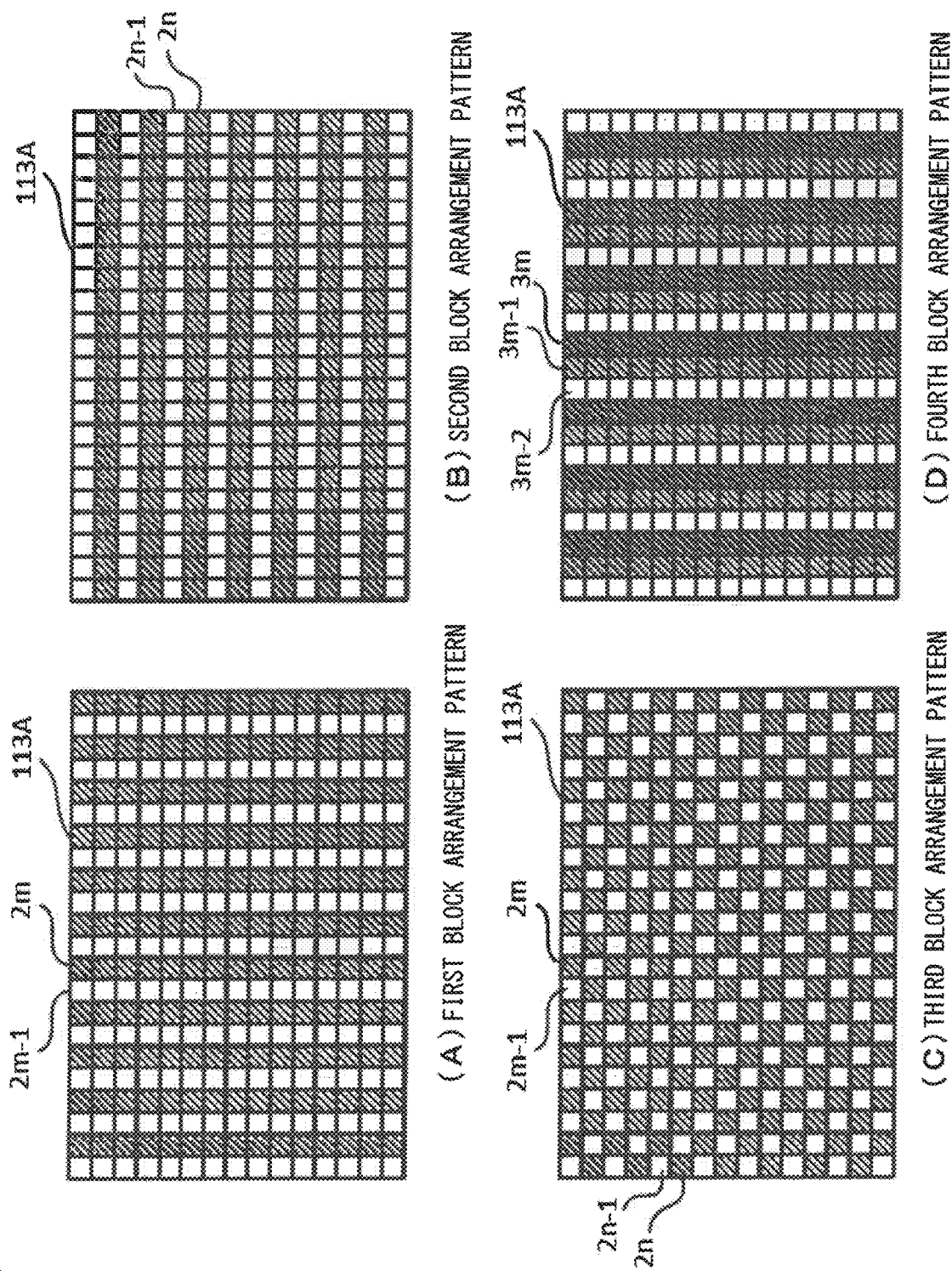
FIG. 8 includes diagrams showing block arrangement patterns.

Next, a block arrangement pattern set by the division unit 71 will be described. FIG. 8 includes diagrams showing block arrangement patterns, in which FIG. 8(A) shows a first block arrangement pattern; FIG. 8(B) shows a second block arrangement pattern; FIG. 8(C) shows a third block arrangement pattern; and FIG. 8(D) shows a fourth block arrangement pattern.

The first block arrangement pattern shown in FIG. 8(A) is a block arrangement pattern in which the pixel region 113A is divided into two regions, first and second regions. In the first block arrangement pattern, the first region of the pixel region 113A is composed of blocks in (2m−1)th columns, and the second region thereof is composed of blocks in (2m)th columns. That is, the blocks in the pixel region 113A are grouped into the odd columns and even columns. As used herein, m is a positive integer (m=1, 2, 3, etc.).

The second block arrangement pattern shown in FIG. 8(B) is also a block arrangement pattern in which the pixel region 113A is divided into two regions, first and second regions. In the second block arrangement pattern, the first region of the pixel region 113A is composed of blocks in (2n−1) th rows, and the second region thereof is composed of blocks in (2n)th rows. That is, the blocks in the pixel region 113A are grouped into the odd rows and even rows. As used herein, n is a positive integer (n=1, 2, 3, etc.).

The third block arrangement pattern shown in FIG. 8(C) is also a block arrangement pattern in which the pixel region 113A is divided into two regions, first and second regions. In the third block arrangement pattern, the first region of the pixel region 113A is composed of blocks in (2m−1)th columns and in (2n−1)th rows and blocks in (2m)th columns and in (2n)th rows. The second region thereof is composed of blocks in (2m) th columns and in (2n−1) th rows and blocks in (2m−1) th columns and in (2n) th rows That is, the pixel region 113A is divided in such a manner that the blocks form a check pattern. As used herein, m and n are positive integers (m=1, 2, 3, etc.; n=1, 2, 3, etc.). In the present embodiment, as shown in FIGS. 8(A) to 8(C), the first and second regions are not necessarily composed of only continuous blocks and may be composed of discrete blocks.

The fourth block arrangement pattern shown in FIG. 8(D) is a block arrangement pattern in which the pixel region 113A is divided into three regions, first to third regions. In the fourth block arrangement pattern, the first region of the pixel region 113A is composed of blocks in (3m−2) th columns; the second region thereof is composed of blocks in (3m−1) th columns; and the third region thereof is composed of blocks in (3m)th columns. As used herein, m is a positive integer (m=1, 2, 3, etc.).

While, in FIG. 8, a small number of blocks are set in the pixel region 113A to make it easy to see the block arrangement in each region, a larger number of blocks than the number of blocks shown in FIG. 8 may be set.

Figure 9:
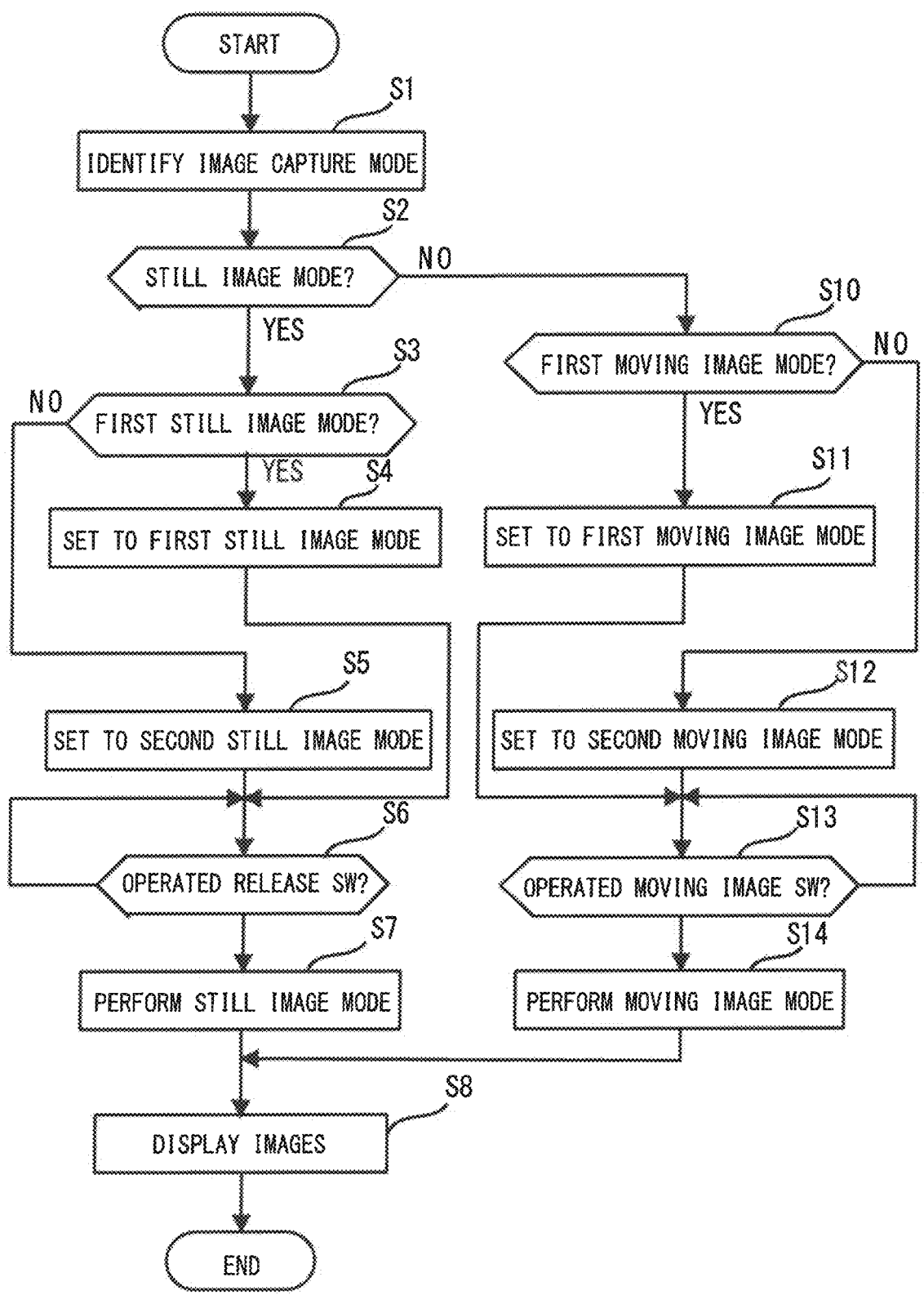
FIG. 9 is a flowchart showing an image capture operation performed by the system control unit.
Figure 10:
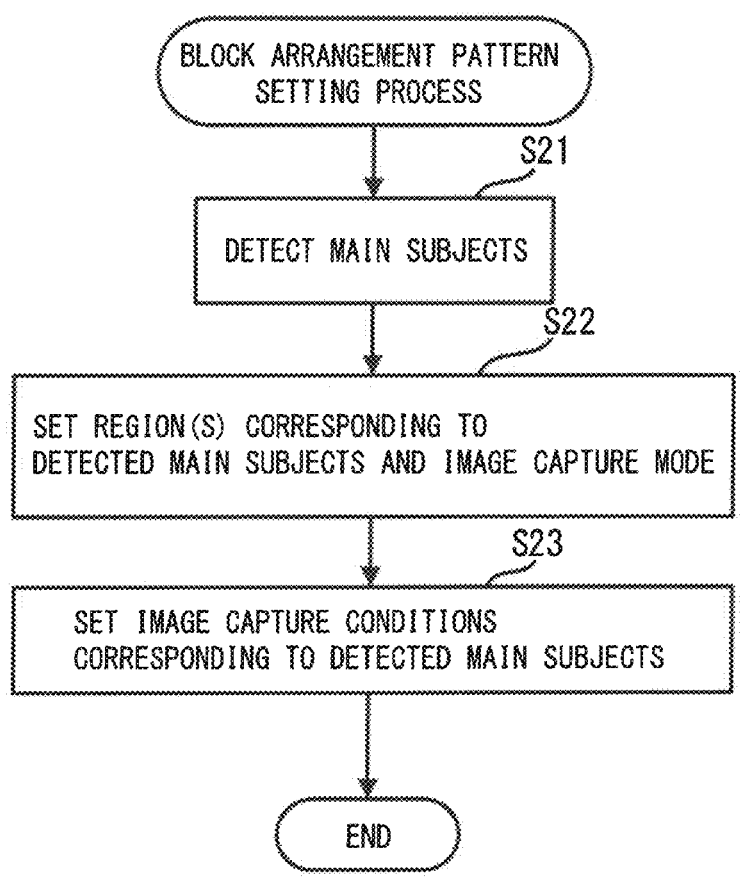
FIG. 10 is a flowchart showing a block arrangement pattern setting process.

Next, an image capture operation according to the first embodiment will be described. FIG. 9 is a flowchart showing an image capture operation performed by the system control unit. FIG. 10 is a flowchart showing a block arrangement pattern setting process. In the process shown in FIG. 9, the system control unit 70 starts to capture images when the electronic apparatus 1 is powered on. Although not shown in FIG. 9, when the system control unit 70 starts to capture images, the display control unit 73 displays live view images captured by the image capture unit 20 on the first display unit 51, as well as displays the menu for setting the image capture mode on the second display unit 53. Since live view images need not be images in which the subject moves smoothly, the drive control unit 72 controls the drive of the image sensor 100 so that the image sensor 100 captures images at a low frame rate. The display control unit 73 may display live view images on the second display unit 53 and may display the menu on the first display unit 51. The display control unit 73 may also display live view images and the menu on the same display unit (first display unit 51 or second display unit 53).

The user operates the multi-selector 55d to select between image capture modes on the menu displayed on the second display unit 53. The division unit 71 identifies the image capture mode that the user has selected by operating the multi-selector 55d (step S1).

The image capture modes include a still image mode in which still images are captured and a moving image mode in which moving images are captured. The still image mode includes a first still image mode and a second still image mode. The moving image mode includes a first moving image mode and a second moving image mode.

The first still image mode refers to an image capture mode in which the image sensor 100 captures still images of the subject using the pixel region (image capture region) 113A thereof as a single region without the division unit 71 dividing the pixel region 113A. The first still image mode is a typical still image mode. The second still image mode is an image capture mode in which the division unit 71 divides the pixel region 113A into multiple regions and the image sensor 100 captures still images of the same subject in the multiple regions. In the second still image mode, the image sensor 100 can continuously capture still images of the same subject in the multiple regions in parallel. Accordingly, a larger number of still images can be captured per unit time by continuously capturing still images in the second still image mode than by continuously capturing still images in the first still image mode. That is, continuous image capture can be performed at higher speed in the second still image mode than in the first still image mode. The second still image mode is also called high-speed continuous shooting mode or still image-still image mixed mode.

The first moving image mode refers to an image capture mode in which the image sensor 100 captures moving images of the subject using the pixel region (image capture region) 113A thereof as a single region without the division unit 71 dividing the pixel region 113A. The first moving image mode is a typical moving image capture mode. The second moving image mode refers to an image capture mode in which the division unit 71 divides the pixel region 113A into multiple regions and the image sensor 100 captures still images of the subject in one of the multiple regions and captures moving images of the same subject in the others of the multiple regions. The second moving image mode is also called still image-moving image simultaneous capture mode or still image-moving image mixed mode.

There may be employed a configuration in which the user selects the image capture mode by touching a corresponding position in the menu on the second touchscreen 54 rather than operating the multi-selector 55d.

The division unit 71 determines whether the image capture mode selected by the user is the still image mode (step S2). If the division unit 71 determines that the image capture mode is the still image mode, it determines whether the still image mode is the first still image mode (step S3). If the division unit 71 determines that the still image mode is the first still image mode, it sets the image capture mode to the first still image mode (step S4). In contrast, if the division unit 71 determines that the still image mode is not the first still image mode, that is, the still image mode is the second still image mode, it sets the image capture mode to the second still image mode (step S5).

In step S4 or step S5, the division unit 71 performs the block arrangement pattern setting process shown in FIG. 10. In the process shown in FIG. 10, the division unit 71 instructs the image processing unit 30 (first image processing unit 30A) to detect main subjects (step S21). The detection unit 32A then detects moving subject and non-moving subjects by making a comparison among multiple pieces of image data chronologically obtained from live view images. The detection unit 32A then outputs the detection result along with the image data to the system control unit 70. The division unit 71 checks whether there are main subjects, on the basis of the detection result from the detection unit 32A. The division unit 71 then sets a region(s) corresponding to the main subject and the image capture mode in the pixel region 113A (step S22).

Specifically, if the image capture mode is the first still image mode, the division unit 71 does not divide the pixel region 113A into multiple regions. That is, the division unit 71 sets the entire pixel region 113A as a single region. At this time, the division unit 71 outputs, to the drive unit 21, an instruction signal instructing the drive unit 21 to set the entire pixel region 113A as a single region.

In contrast, if the image capture mode is the second still image mode, the division unit 71 selects one of the block arrangement patterns shown in FIGS. 8(A) to 8(D). The division unit 71 then checks whether the main subject is a moving subject, on the basis of the detection result from the detection unit 32A. If the main subject is not a moving subject but a non-moving subject, the division unit 71 sets first and second regions in accordance with the third block arrangement pattern shown in FIG. 8(C). If the main subject is a moving subject, the division unit 71 identifies the moving direction of the moving subject. If the moving direction of the moving subject is mostly vertical, for example, if the main subject is a child who is sliding down a slide, a waterfall, or the like, the division unit 71 sets first and second regions in accordance with the first block arrangement pattern shown in FIG. 8(A). If the moving direction of the moving subject is mostly horizontal, for example, if the main subject is a running person or the like or if the user is panning, the division unit 71 sets first and second regions in accordance with the second block arrangement pattern shown in FIG. 8(B). If the vertical moving speed of the moving subject is high, the division unit 71 sets first to third regions in accordance with the fourth block arrangement pattern shown in FIG. 8(D). In step S22, the division unit 71 outputs, to the drive unit 21, an instruction signal indicating the block positions or the like in the respective regions (first and second regions, first to third regions).

Figure 11:
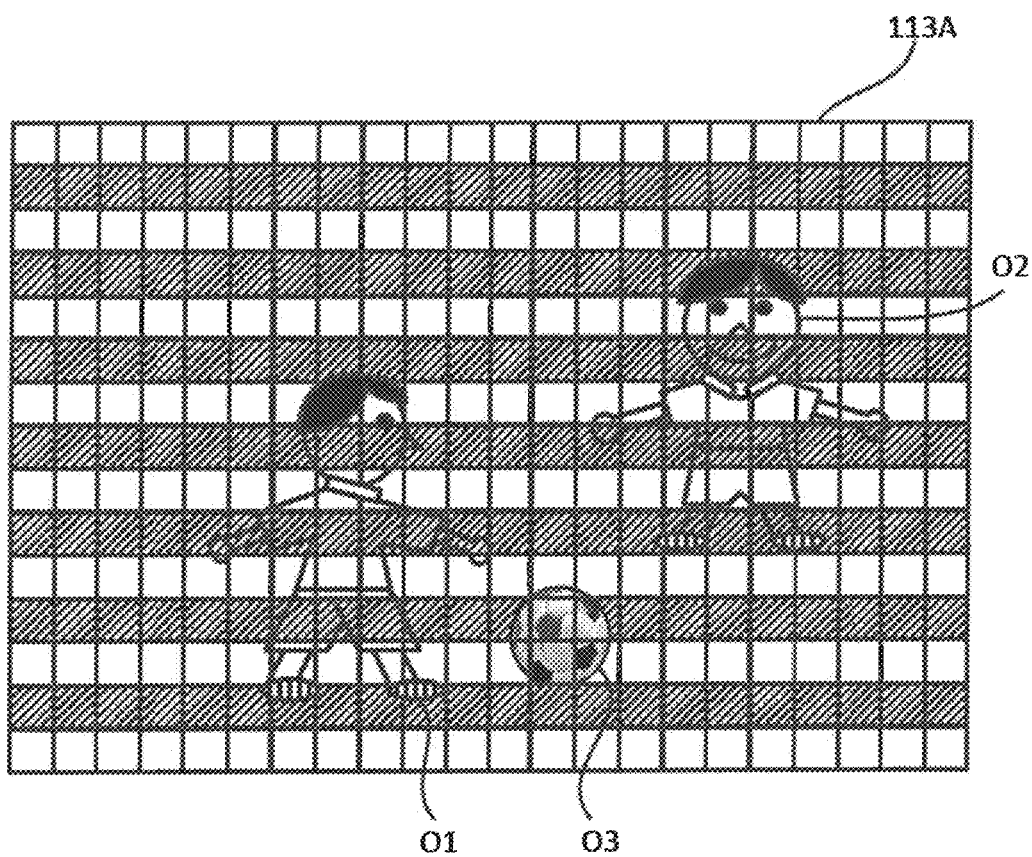
FIG. 11 is a diagram showing an example of a second block arrangement pattern set in a second still image mode.

FIG. 11 is a diagram showing an example of the second block arrangement pattern set in the second still image mode. Note that in FIG. 11, the blocks are scaled up in order to make it easy to see the block arrangement. In practice, smaller blocks than the blocks shown in FIG. 11 are set in the pixel region 113A. In the example shown in FIG. 11, the detection unit 32A detects persons O1, O2 who are playing soccer and a soccer ball O3 as main subjects (moving subjects). The division unit 71 determines that the main subjects O1 to O3 are moving subjects and the moving directions of the moving subjects are mostly horizontal, on the basis of the detection result from the detection unit 32A. As a result, the division unit 71 sets first and second regions in accordance with the second block arrangement pattern shown in FIG. 8(B). At this time, the division unit divides the pixel region 113A in such a manner that the main subjects O1 to O3 are contained in both the first and second regions.

Referring back to FIG. 10, the drive control unit 72 sets image capture conditions for the regions set in step S22 (the first and second regions in the example shown in FIG. 11) on the basis of the detection result from the detection unit 32A (step S23). Specifically, the drive control unit 72 outputs, to the drive unit 21, an instruction signal indicating image capture conditions (charge accumulation times, gains, etc.) corresponding to the main subjects. The drive control unit 72 also outputs, to the image processing unit 30, an instruction signal indicating image capture conditions (parameters such as color signal processing, white balance adjustment, gradation adjustment, and compressibility) corresponding to the main subjects. For example, if the detection unit 32A detects a moving subject, the drive control unit 72 increases the gain (ISO sensitivity), as well as reduces the charge accumulation time (that is, exposition time, shutter speed). If the detection unit 32A does not detect any moving subject, the drive control unit 72 reduces the gain, as well as increases the charge accumulation time.

Referring back to FIG. 9, the drive control unit 72 determines whether the user has operated the release switch 55a (pressed it all the way following halfway) (step S6). If the drive control unit 72 determines that the user has operated the release switch 55a, it causes the image capture unit 20 to capture images in the still image mode (first still image mode or second still image mode) (step S7).

Figure 12:
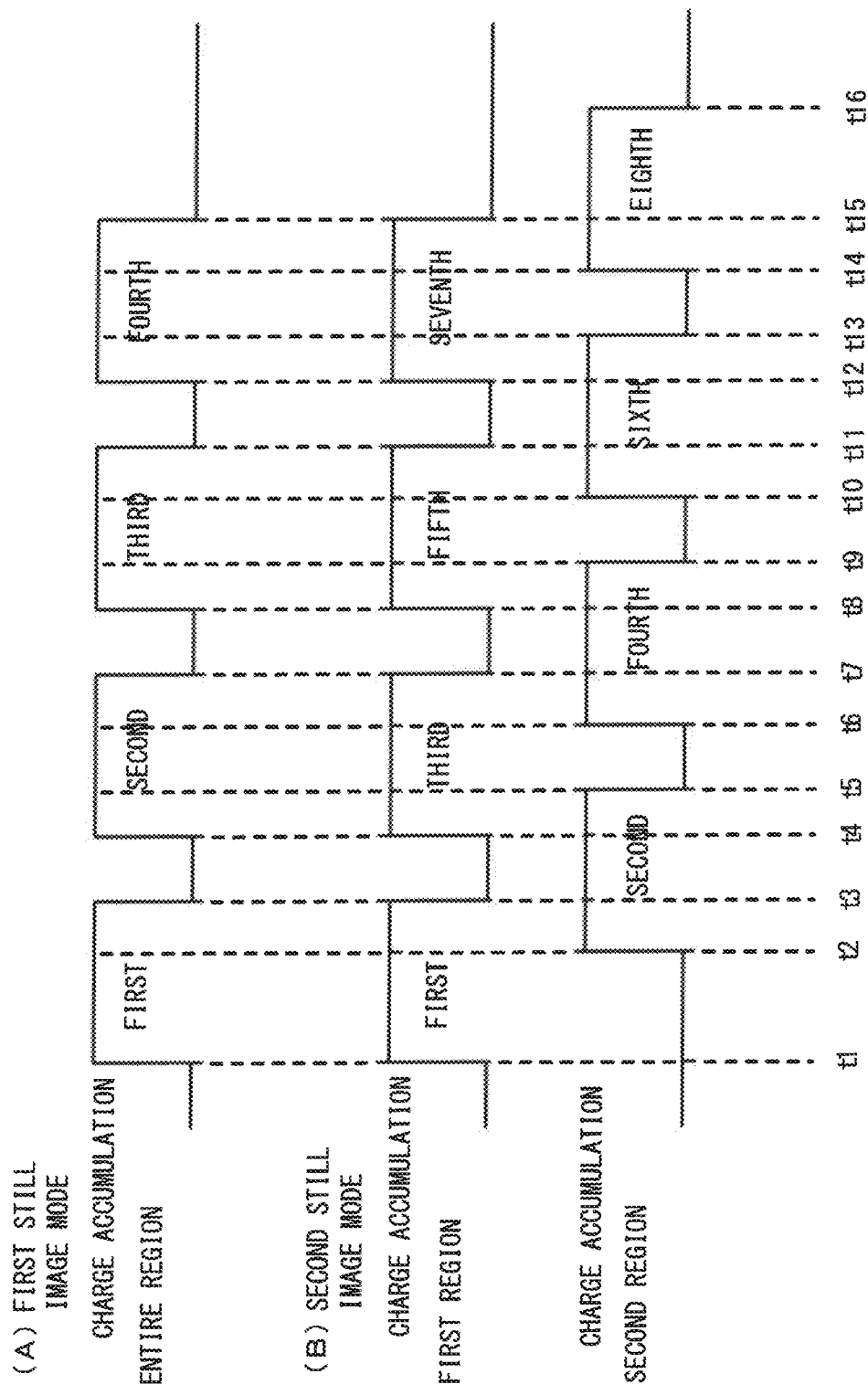
FIG. 12 includes timing charts showing charge accumulation timings in a first still image mode or second still image mode.

FIG. 12 is a timing chart showing charge accumulation timings in the first still image mode and second still image mode. In the first still image mode (typical continuous shooting mode) shown in FIG. 12(A), as described above, the entire pixel region 113A is set as a single region. While the user operates the release switch 55a (presses it all the way) in the first still image mode, the drive control unit 72 outputs, to the drive unit 21, an instruction signal instructing the drive unit 21 to repeatedly capture a still image in the entire pixel region 113A. In FIG. 12(A), the drive unit 21 causes the image sensor 100 to start charge accumulation in the pixel region 113A at time t1 and to end the charge accumulation in the pixel region 113A at time t3. The drive unit 21 then reads pixel signals from the pixels in the pixel region 113A and resets the charge accumulated in each pixel. Subsequently, the drive unit 21 causes the image sensor 100 to starts charge accumulation in the pixel region 113A at time t4 and to end the charge accumulation in the pixel region 113A at time t7. While the user operates the release switch 55a, the drive unit 21 repeatedly performs the drive control of the image sensor 100 as described above.

In the example shown in FIG. 12(A), the drive unit 21 has captured an image four times continuously in the period from time t1 to time t15. The period from time t1 to time t3, the period from time t4 to time t7, the period from time t8 to time t11, and the period from time t12 to time t15 are charge accumulation times (exposure times). These charge accumulation times (exposure times) are set in the image capture condition setting process in step S23. The pixel signals read from the pixels in the image sensor 100 are amplified by the amplifier 412 using the gain indicated by the division unit 71 and then outputted to the image processing unit 30. The image generation unit 31 (e.g., the image generation unit 31A) identifies the parameters used in image processing, such as color signal processing, on the basis of the instruction signal outputted from the division unit 71 and indicating the image capture conditions. The image generation unit 31 then generates image data by performing various types of image processing on RAW data composed of the pixel signals on the basis of the parameters.

In the second still image mode (high-speed continuous shooting mode) shown in FIG. 12(B), the drive unit 21 sets, for example, first and second regions. While the user operates the release switch 55a (presses it all the way) in the second still image mode, the drive control unit 72 outputs, to the drive unit 21, an instruction signal instructing the drive unit 21 to repeatedly capture a still image in both the first and second regions. In FIG. 12(B), the drive unit 21 causes the image sensor 100 to start charge accumulation in the first region at time t1 and to end the charge accumulation in the first region at time t3. The drive unit 21 reads pixel signals from the pixels in the first region and resets the charge accumulated in each pixel. Subsequently, the drive unit 21 causes the image sensor 100 to start charge accumulation in the first region at time t4 and to end the charge accumulation in the first region at time t7. While the user operates the release switch 55a, the drive unit 21 repeatedly performs the drive control of the image sensor 100 as described above.

In FIG. 12(B), the drive unit 21 causes the image sensor 100 to start charge accumulation in the second region at time t2 and to end the charge accumulation in the second region at time t5. The drive unit 21 then reads pixel signals from the pixels in the second region and resets the charge accumulated in each pixel. Subsequently, the drive unit 21 causes the image sensor 100 to start charge accumulation in the second region at time t6 and to end the charge accumulation in the second region at time t9. While the user operates the release switch 55a, the drive unit 21 repeatedly performs the drive control of the image sensor 100 as described above.

In the example shown in FIG. 12(B), the drive unit 21 has captured an image in the first region four times continuously in the period from time t1 to time t15. Further, in parallel with the four-time image capture in the first region, the drive unit 21 has captured an image in the second region four times continuously in the period from time t2 to time t16. This means that the drive unit 21 has captured an image in the first and second regions eight times continuously in the period from time t1 to time t16.

The period from time t1 to time t3, the period from time t4 to time t7, the period from time t8 to time t11, and the period from time t12 to time t15 are charge accumulation times (exposure times) in the first region. These charge accumulation times (exposure times) are set in the image capture condition setting process in step S23. The period from time t2 to time t5, the period from time t6 to time t9, the period from time t10 to time t13, and the period from time t14 to time t16 are charge accumulation times (exposure times) in the second region. These charge accumulation times (exposure times) are also set in the image capture condition setting process in step S23.

The pixel signals read from the pixels in the first region of the image sensor 100 are amplified by the amplifier 412 using the gain indicated by the division unit 71 and then outputted to the image processing unit 30. The image generation unit 31A identifies the parameters used in image processing, such as color signal processing, on the basis of the instruction signal outputted from the division unit 71 and indicating the image capture conditions of the first region. The image generation unit 31A then generates first-region image data by performing various types of image processing on RAW data composed of the pixel signals from the pixels in the first region on the basis of the parameters.

The pixel signals read from the pixels in the second region of the image sensor 100 are amplified by the amplifier 412 using the gain indicated by the division unit 71 and then outputted to the image processing unit 30. The image generation unit 31B identifies the parameters used in image processing, such as color signal processing, on the basis of the instruction signal outputted from the division unit 71 and indicating the image capture conditions of the second region. The image generation unit 31B then generates second-region image data by performing various types of image processing on RAW data composed of the pixel signals from the pixels in the second region on the basis of the parameters. Further, the image generation unit 31 (image generation unit 31A or 31B) combines the first-region image data and second-region image data.

In the second still image mode shown in FIG. 12(B), the drive control unit 72 causes the drive unit 21 to control the drive of the image sensor 100 so that the image sensor 100 starts to capture images in the first and second regions at different timings. Accordingly, assuming that the image sensor 100 can capture, for example, 30 still images per minute in the first still image mode shown in FIG. 12(A), it can capture approximately 60 still images per minute, which is approximately double that in the first still image mode, in the second still image mode shown in FIG. 12(B). In this case, the pixel region 113A is divided into the first and second regions and therefore the number of pixels in a still image is halved. However, assuming that the pixel region has 20 million pixels, a still image having 10 million pixels, which is half the 20 million pixels, is captured. Such a still image is thought to provide sufficient image quality for the user.

If the division unit 71 sets first to third regions in the pixel region 113A in accordance with the fourth block arrangement pattern shown in FIG. 8(D) in the second still image mode, continuous image capture can be performed at higher speed than when setting the first and second regions in the pixel region 113A. For example, assuming that 30 still images can be captured per minute in the first still image mode, if three regions are set in the pixel region 113A in the second still image mode, approximately 90 images per minute, which is approximately three times that in the first still image mode, can be captured. Image sensors 100 are expected to have more pixels from now on. For this reason, even if the pixel region 113A is divided into three regions and thus the number of pixels in one still image is reduced to ⅓, the user would pay higher attention to the high speed of continuous image capture than to the reduction in image quality.

Referring back to FIG. 9, the display control unit 73 outputs the image data generated by the image processing unit 30 to the display unit 50 so as to display still images on the first display unit 51 or second display unit 53 (step S8). If the drive control unit 72 causes the drive unit 21 to capture still images in the first still image mode, the display control unit 73 displays the still images on the first display unit 51. In contrast, if the drive control unit 72 causes to the drive unit 21 to capture still images in the second still image mode, the display control unit 73 displays, on the first display unit 51, multiple still images as thumbnail images obtained by capturing a still image multiple times continuously. Further, the display control unit 73 displays a thumbnail image selected by the user on the second display unit 53 in an enlarged manner.

Figure 13:
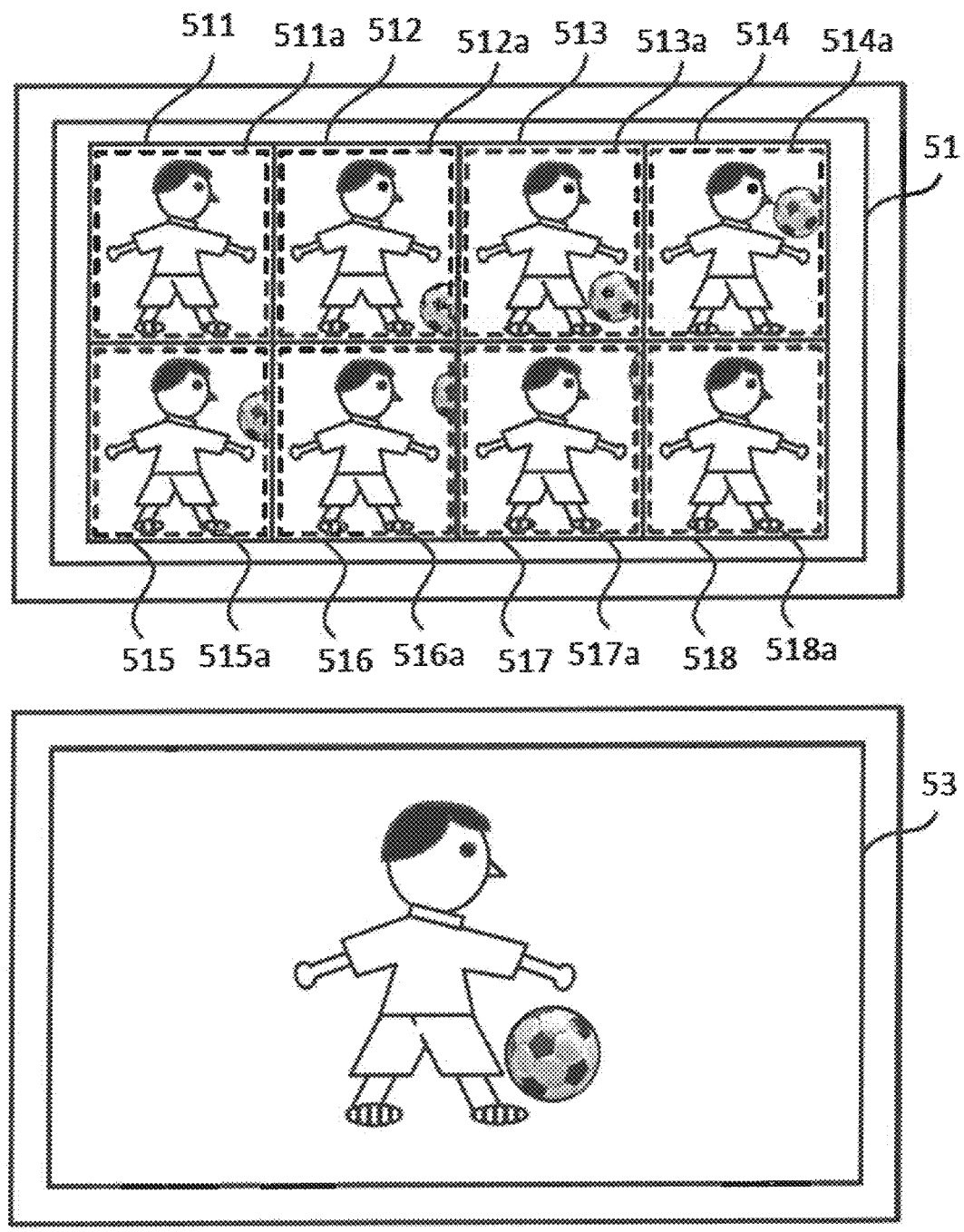
FIG. 13 is a drawing showing an example display in which still images are displayed on first and second display units.

FIG. 13 is a drawing showing an example display in which still images are displayed on the first display unit and second display unit. As shown in FIG. 13, the display control unit 73 is displaying eight thumbnail images (still images) 511 to 518 side by side on the first display unit 51. For example, the thumbnail image 511 is a still image resulting from the first image capture in FIG. 12(B). Similarly, the thumbnail images 512 to 518 are still images resulting from the second to eighth image capture in FIG. 12(B).

As shown in FIG. 13, eight touch regions 511a to 518a are formed on the first touchscreen 52 in such a manner that the eight touch regions 511a to 518a are superimposed on the eight thumbnail images 511 to 518, respectively. When any of the touch regions 511a to 518a detects that it has been pressed (touched) by the user, the touch region outputs a detection signal indicating the pressed position (the pressed touch region) to the system control unit 70.

The display control unit 73 displays a thumbnail image corresponding to the touch region pressed by the user on the second display unit 53 in an enlarged manner. In the example shown in FIG. 13, in response to the user pressing the touch region 513a, the thumbnail image 513 corresponding to the touch region 513a is being displayed on the second display unit 53 in an enlarged manner.

Referring back to FIG. 9, if the division unit 71 determines in step S2 that the image capture mode is not the still image mode, that is, the image capture mode is the moving image mode, it determines whether the moving image mode is the first moving image mode (step S10). If the division unit 71 determines that the moving image mode is the first moving image mode, it sets the image capture mode to the first moving image mode (step S11). In contrast, if the division unit 71 determines that the moving image mode is not the first moving image mode, that is, the moving image mode is the second moving image mode, it sets the image capture mode to the second moving image mode (step S12).

In step S11 or step S12, the division unit 71 performs the block arrangement pattern setting process shown in FIG. 10. In the process shown in FIG. 10, the division unit 71 instructs the image processing unit 30 (first image processing unit 30A) to detect main subjects (step S21). The detection unit 32A then detects a moving subject and a non-moving subject by making a comparison among multiple pieces of image data chronologically obtained from live view images. In the present embodiment, the detection unit 32A recognizes a face in the pieces of image data on the basis of eyes, mouse, the color of a skin, or the like and detects the face as a moving subject. Further, in the present embodiment, the detection unit 32A detects the face, as well as detects a human body (person) included in the pieces of image data as a moving subject. The detection unit 32A then outputs the detection result along with the pieces of image data to the system control unit 70. The division unit 71 checks whether there are main subjects, on the basis of the detection result from the detection unit 32A. The division unit 71 then sets a region(s) corresponding to the main subjects and the image capture mode in the pixel region 113A (step S22).

Specifically, if the image capture mode is the first moving image mode, the division unit 71 does not divide the pixel region 113A into multiple regions. That is, the division unit 71 sets the entire pixel region 113A as a single region. At this time, the division unit 71 outputs, to th drive unit 21, an instruction signal instructing the drive unit 21 to set the entire pixel region 113A as a single region.

In contrast, if the image capture mode is the second moving image mode, the division unit 71 selects one of the arrangement patterns shown in FIGS. 8(A) to 8(D). The division unit 71 then checks whether the main subject is a moving subject, on the basis of the detection result from the detection unit 32A. If the main subject is not a moving subject but a non-moving subject, the division unit 71 sets first and second regions in accordance with the third block arrangement pattern shown in FIG. 8(C). If the main subject is a moving subject, the division unit 71 identifies the moving direction of the moving subject. If the moving direction of the moving subject is mostly vertical, the division unit 71 sets first and second regions in accordance with the first block arrangement pattern shown in FIG. 8(A). If the moving direction of the moving subject is mostly horizontal, the division unit 71 sets first and second regions in accordance with the second block arrangement pattern shown in FIG. 8(B). Further, if the vertical moving speed of the moving subject is high, the division unit 71 sets first to third regions in accordance with the fourth block arrangement pattern shown in FIG. 8(D). In step S22, the division unit 71 outputs, to the drive unit 21, an instruction signal indicating the block positions or the like in the respective regions (first and second regions, first to third regions).

Figure 14:
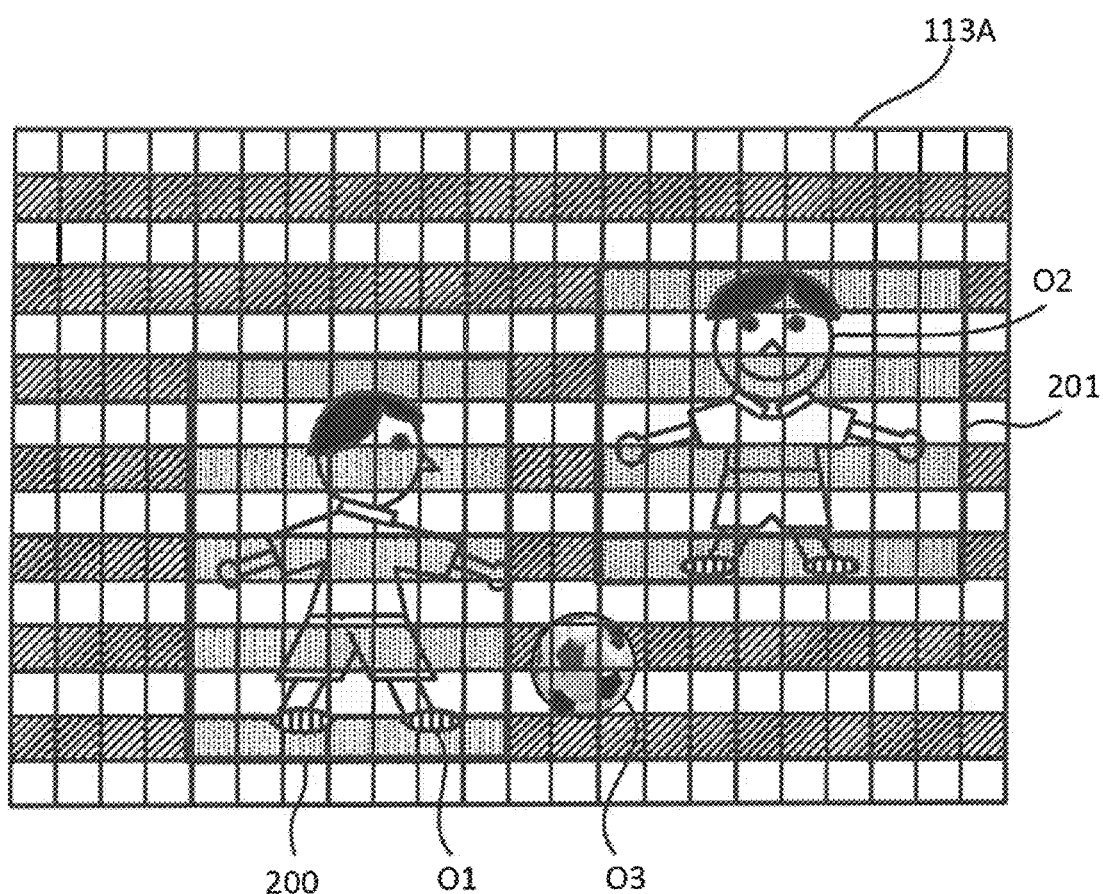
FIG. 14 is a diagram showing an example of the second block arrangement pattern set in a second moving image mode.

FIG. 14 is a diagram showing an example of the second block arrangement pattern set in the second moving image mode. In FIG. 14, the blocks are scaled up in order to make it easy to see the block arrangement. In practice, smaller blocks than the blocks shown in FIG. 14 are set in the pixel region 113A. In the example shown in FIG. 14, the detection unit 32A detects persons O1, O2 who are playing soccer and a soccer ball O3 as main subjects (moving subjects). The detection unit 32A detects the persons O1, O2 included in image data as moving subjects. The division unit 71 determines that the main subjects O1 to O3 are moving subjects and the moving directions of the moving subjects are mostly horizontal, on the basis of the detection result from the detection unit 32A. As a result, the division unit 71 sets first and second regions in accordance with the second block arrangement pattern shown in FIG. 8(B). The division unit 71 also determines that the moving subjects O1, O2 are persons. As a result, the division unit 71 defines regions 200, 201 surrounding the moving subjects O1, O2 in the second region as second regions A and a region other than the regions 200, 201 surrounding the moving subjects O1, O2 as a second region B.

Referring back to FIG. 10, the drive control unit 72 sets image capture conditions for the regions (the first region, second regions A, and second region B in the example shown in FIG. 14) set in step S22 on the basis of the detection result from the detection unit 32A (step S23). Specifically, the drive control unit 72 outputs, to the drive unit 21, an instruction signal indicating image capture conditions (frame rates, gains, etc.) corresponding to the main subjects. The drive control unit 72 also outputs, to the image processing unit 30, an instruction signal indicating image capture conditions (parameters, such as color signal processing, white balance adjustment, gradation adjustment, and compressibility) corresponding to the main subjects.

For example, if the detection unit 32A detects moving subjects, the drive control unit 72 increases the gain (ISO sensitivity) of the first region, as well as reduces the charge accumulation time of the first region. If the detection unit 32A does not detect any moving subject, the drive control unit 72 reduces the gain of the first region, as well as increases the charge accumulation time of the first region. Further, if the detection unit 32A detects moving subjects, the drive control unit 72 increases the frame rates of the regions of the moving subjects (the regions 200, 201 surrounding the moving subjects O1, O2, that is, the second regions A). The frame rate of the region of the non-moving subject (the region other than the regions surrounding the moving subjects O1, O2, that is, the second region B) is made lower than that of the second regions A.

Referring back to FIG. 9, the drive control unit 72 determines whether the user has operated the moving image switch 55c (step S13). If the drive control unit 72 determines that the user has operated the moving image switch 55c, it causes the image capture unit 20 to capture images in the moving image mode (first moving image mode or second moving image mode) (step S14). Image capture in the first moving image mode is similar to typical moving image capture and therefore will not be described in detail.

Figure 15:
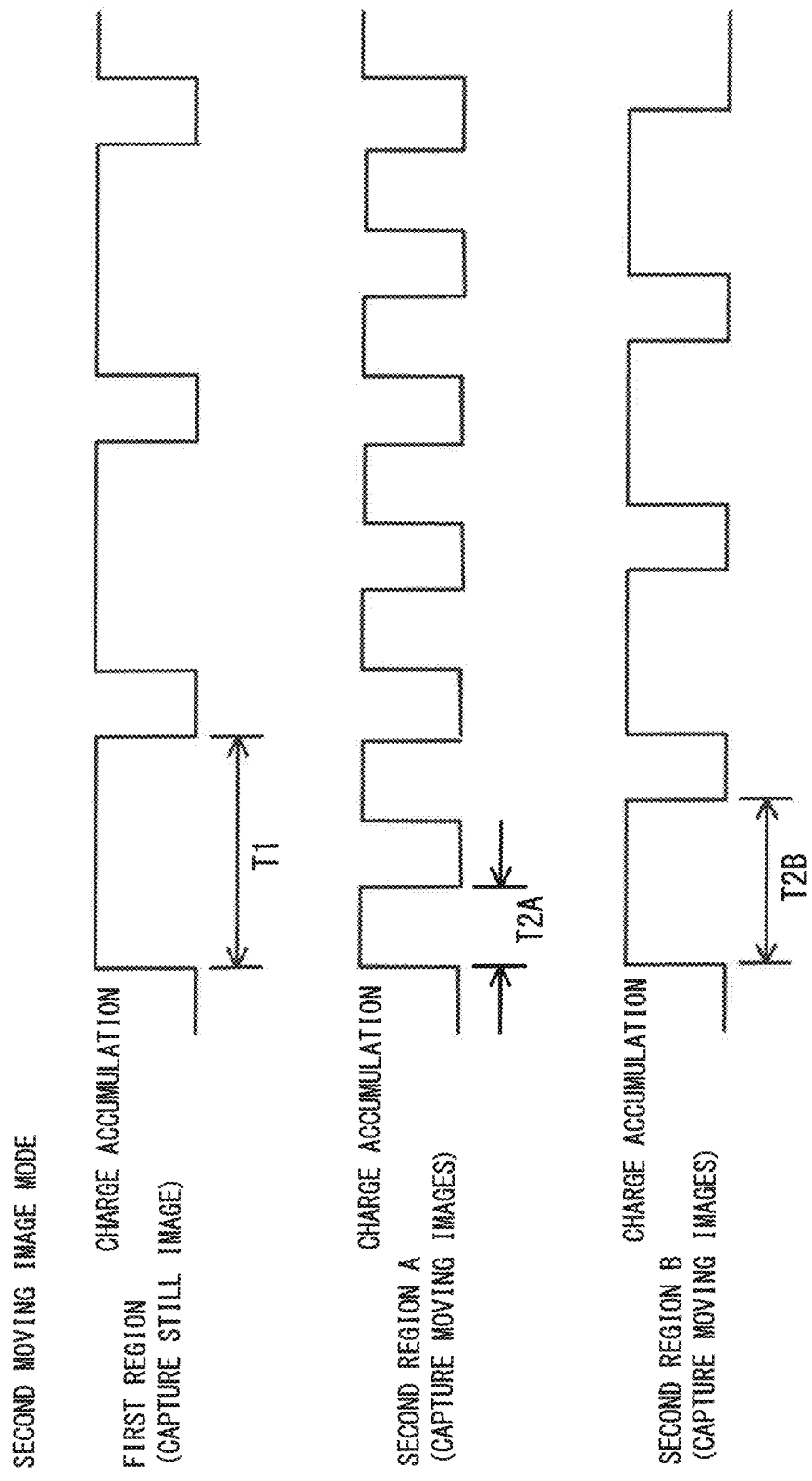
FIG. 15 is a timing chart showing charge accumulation timings in the second moving image mode.

FIG. 15 is a timing chart showing charge accumulation timings in the second moving image mode. For example, a first region, a second region A, and a second region B are set in the second moving image mode (still image-moving image mixed mode) shown in FIG. 15. While the user operates the release switch 55c in the second moving image mode, the drive control unit 72 outputs, to the drive unit 21, an instruction signal instructing the drive unit 21 to repeatedly capture a still image in the first region and to capture moving images in the second regions A and B. In FIG. 15, while the user operates the release switch 55c, the drive unit 21 causes the image sensor 100 to capture a still image by accumulating charge in the pixels of the first region for a charge accumulation time TI. Further, while the user operates the release switch 55c, the drive unit 21 causes the image sensor 100 to capture moving images in the second region A by accumulating charge in the pixels of the second region A for a charge accumulation time T2A. Furthermore, while the user operates the release switch 55c, the drive unit 21 causes the image sensor 100 to capture moving images the second region B by accumulating charge in the pixels of the second region B for a charge accumulation time T2B which is longer than the charge accumulation time T2A. The frame rate varies with the charge accumulation time. Accordingly, the frame rate of moving images varies between when images are captured for the charge accumulation time T2A and when images are captured for the charge accumulation time T2B. For example, the frame rate corresponding to the charge accumulation time T2A of the second region A is 60 fps, and the frame rate corresponding to the charge accumulation time T2B of the second region B is 30 fps. The charge accumulation time or frame rate is set in the image capture condition setting process in step S23.

Pixel signals read from the pixels in the first region of the image sensor 100 are amplified by the amplifier 412 using the gain indicated by the division unit 71 and then outputted to the image processing unit 30. The image generation unit 31A identifies the parameters used in image processing, such as color signal processing, on the basis of the instruction signal outputted from the division unit 71 and indicating the image capture conditions of the first region. The image generation unit 31A then generates first-region image data by performing various types of image processing on RAW data composed of the pixel signals from the pixels in the first region on the basis of the parameters.

Pixel signals read from the pixels in the second region A of the image sensor 100 are amplified by the amplifier 412 using the gain indicated by the division unit 71 and then outputted to the image processing unit 30. The image generation unit 31B identifies the parameters used in image processing, such as color signal processing, on the basis of the instruction signal outputted from the division unit 71 and indicating the image capture conditions of the second region A. The image generation unit 31B then second-region-A image data by performing various types of image processing on RAW data composed of the pixel signals from the pixels in the second region A on the basis of the parameters.

Pixel signals read from the pixels in the second region B of the image sensor 100 are amplified by the amplifier 412 using the gain indicated by the division unit 71 and then outputted to the image processing unit 30. The image generation unit 31B identifies the parameters used in image processing, such as color signal processing, on the basis of the instruction signal outputted from the division unit 71 and indicating the image capture conditions of the second region B. The image generation unit 31B then generates second-region-B image data by performing various types of image processing on RAW data composed of the pixel signals from the pixels in the second region B on the basis of the parameters. Further, the image generation unit 31 (image generation unit 31A or 31B) combines the second-region-A image data and the second-region-B image data. Furthermore, the image generation unit 31 (image generation unit 31A or 31B) combines the first-region image data, second-region-A image data, and second-region-B image data.

Since the frame rate of the second region A is made higher than the frame rate of the second region B as described above, the persons O1, O2 serving as moving subjects move smoothly in moving images.

Referring back to FIG. 9, the display control unit 73 outputs the moving image data generated by the image processing unit 30 to the display unit 50 so as to display moving images on the first display unit 51 (step S8). The display control unit 73 also outputs the still image data generated by the image processing unit 30 to the display unit 50 so as to display still images on the second display unit 53 (step S8).

FIG. 16 is a drawing showing an example display in which moving images are displayed on the first display unit and a still image is displayed in the second display unit. As shown in FIG. 16, the display control unit 73 is displaying, on the first display unit 51, moving images (moving images in which the two persons are playing soccer) resulting from the combination of the second regions A and B by the image generation unit 31. The display control unit 73 is also displaying the still image of the first region generated by the image generation unit 31 on the second display unit.

As described above, the electronic apparatus 1 of the first embodiment includes the drive control unit 72, which controls the drive of the image sensor 100, the division unit 71, which divides the pixel region 113A of the image sensor 100 into at least first and second regions, and the image generation unit 31, which generates a first image by capturing an image of the same subject in the first region and generates a second image by capturing an image of the subject in the second region. According to this configuration, multiple types of images (multiple still images, a still image and moving images, etc.) of the same subject can be generated. Thus, multiple types of images can be generated in accordance with the subject or image capture situation. That is, the electronic apparatus 1 including the image sensor 100 provides high usability.

Further, the drive control unit 72 controls the drive of the image sensor 100 so that the image sensor 100 starts to capture images in the first and second regions at different timings. According to this configuration, multiple types of images of the same subject can be generated at various timings. Further, many images can be generated per unit time. Thus, the user can capture images without letting good image capture timings slip away.

Further, the drive control unit 72 captures images in the second region while capturing images in the first region. Thus, it is possible to capture images in the first and second regions in parallel and thus to capture images of the same subject in such a manner that the exposure times of the images overlap each other. As a result, images of the same subject can be captured at timings when images cannot be captured conventionally. The drive control unit 72 also sets at least one of different frame rates, different gains, and different exposure times for the first region and second region of the image sensor 100 as image capture conditions. According to this configuration, the user can obtain multiple types of images captured on different image capture conditions.

Further, the image generation unit 31 generates a still image on the basis of at least one of an image captured in the first region and an image captured in the second region. Thus, multiple types of still images of the same subject can be generated. Further, the image generation unit 31 generates moving images on the basis of one of images captured in the first region and images captured in the second region. Thus, a still image and moving images of the same subject can be generated. Further, the image generation unit 31 corrects the first and second regions using at least one of different white balances, different gradations, and different color corrections. Thus, the user can obtain multiple types of images processed on the basis of different parameters.

Further, the division unit 71 forms a first region from multiple discrete regions (multiple discrete blocks). Thus, a reduction in the resolution of parts of an image is prevented. Further, the division unit 71 variably divides the pixel region into first and second regions. Thus, the pixel region can be divided into regions in accordance with various situations such as the image capture mode and the subject type.

Further, the detection unit 32A detects a main subject from images generated by the image generation unit 31, and the division unit 71 divides the pixel region into first and second regions in such a manner that the main subject is contained in both the first and second regions. Thus, an image of the main subject in the first region and an image of the main subject in the second region can be generated. Further, the display control unit 73 displays an image generated by the image generation unit 31 on the display unit 50. Thus, the user can check the image displayed on the display unit 50. Further, the image sensor 100 has a structure in which a back-illuminated image capture chip and a signal processing chip are stacked. Thus, the volume required to contain the image sensor 100 can be reduced. Further, the drive of the image sensor 100 is controlled on the basis of an instruction from the system control unit 70. Thus, the load of the system control unit 70 can be reduced, and the image sensor 100 can be easily mounted on the electronic apparatus 1.

While the electronic apparatus 1 according to the first embodiment shown in FIG. 5 includes the display unit 50, the display unit 50 may be disposed outside the electronic apparatus. In this case, the system control unit 70 and display unit 50 are each provided with a communication unit that receives and transmits signals (image data, control signals, and the like) by wire or wirelessly. Further, the image processing unit 30 and system control unit 70 may be formed integrally with each other. In this case, the respective functions of the image processing unit 30 and system control unit 70 are implemented when a system control unit including one or more CPUs performs processing on the basis of a control program. While the image processing unit 30 includes the two image processing units, 30A and 30B, it may include only one image processing unit.

Next, a modification of the first embodiment will be described. The block arrangement patterns in FIGS. 8(A) to 8(C) are set such that the first and second regions have the same area. Specifically, the block arrangement patterns are set such that the first and second regions have the same number of pixels. The block arrangement pattern in FIG. 8(D) is set such that the first to third regions have the same area. Specifically, the block arrangement pattern is set such that the first to third regions have the same number of pixels. However, a block arrangement pattern may be set such that respective regions have different areas (the different numbers of pixels).

Figure 17:
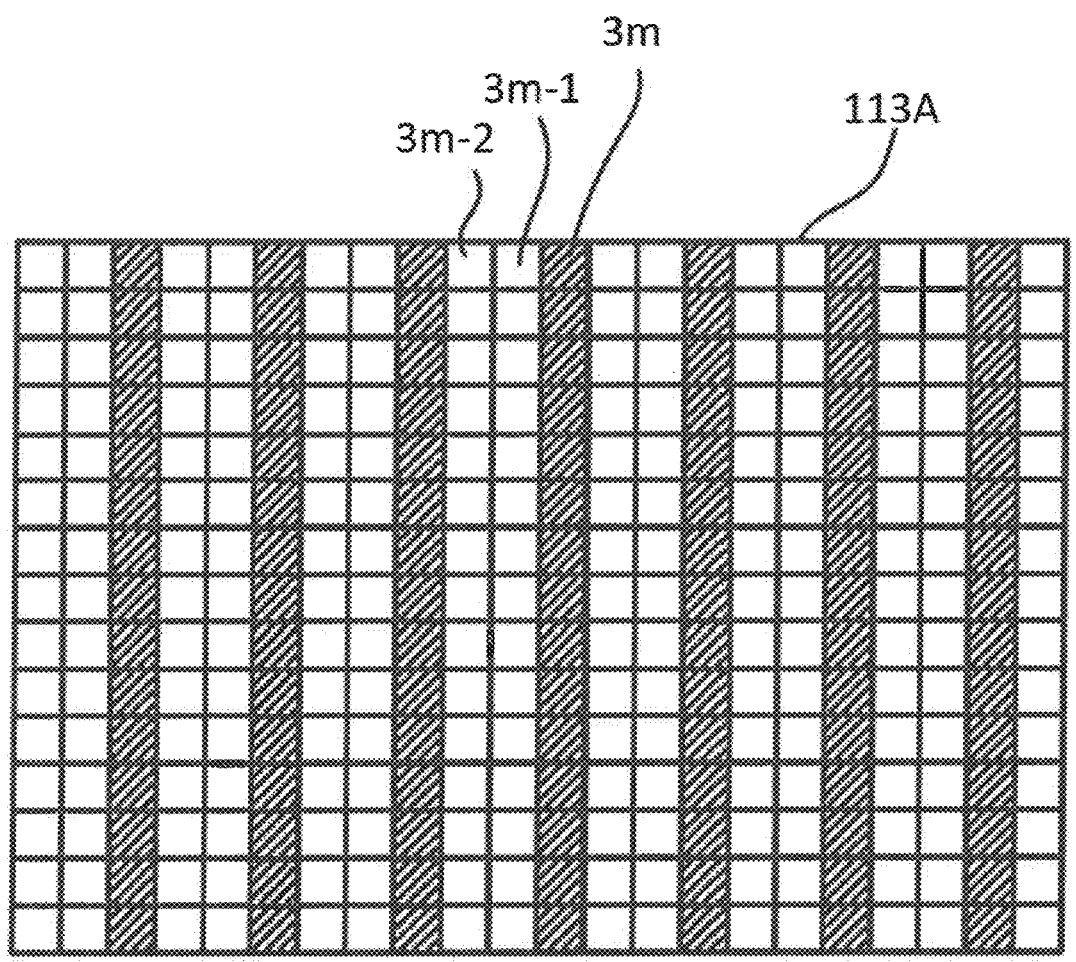
FIG. 17 is a diagram showing a fifth block arrangement pattern.

FIG. 17 is a diagram showing a fifth block arrangement pattern. The fifth block arrangement pattern shown in FIG. 17 is a block arrangement pattern in which the pixel region 113A is divided into two regions, first and second regions. In the fifth block arrangement pattern, the second region of the pixel region 113A is composed of blocks in (3m)th columns, and the first region thereof is composed of blocks other than the blocks in the second region, that is, the first region is composed of blocks in (3m−2)th columns and blocks in (3m−1)th columns. As used herein, m is a positive integer (m=1, 2, 3, etc.). In this block arrangement pattern, the ratio between the areas of the first and second regions is 2:1.

Figure 18:
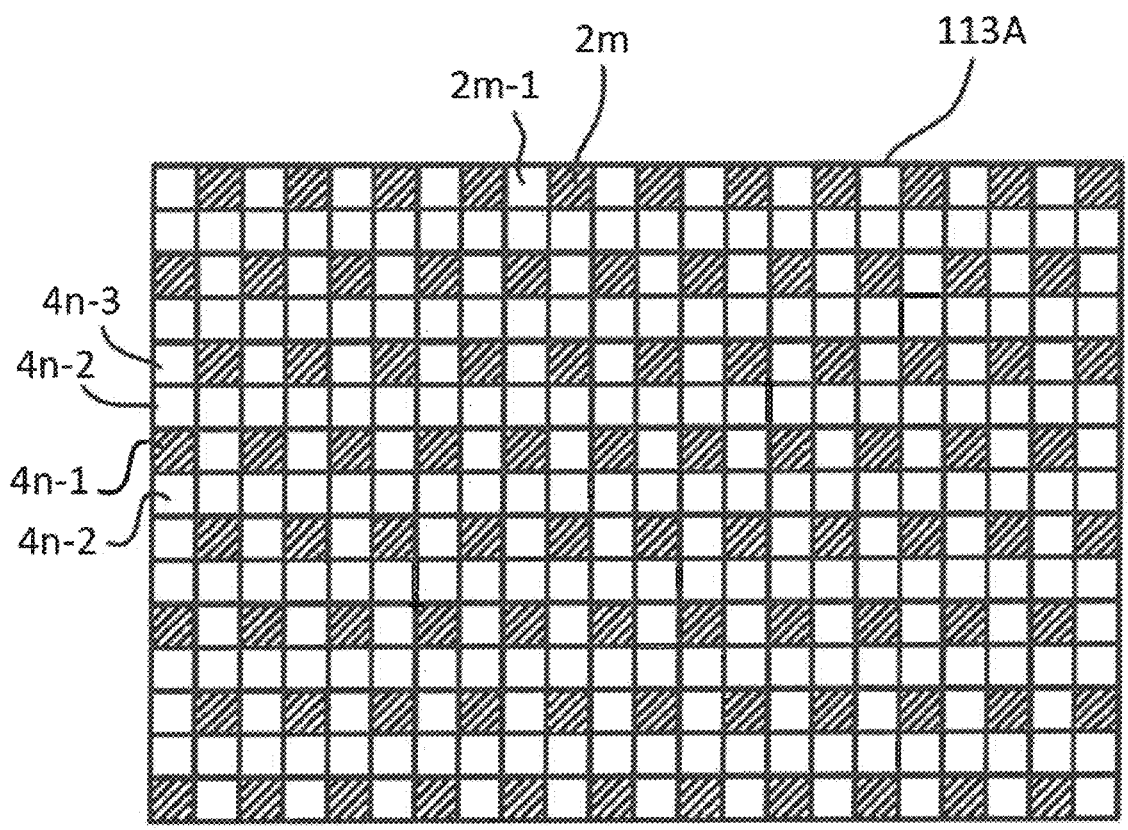
FIG. 18 is a diagram showing a sixth block arrangement pattern.

FIG. 18 is a diagram showing a sixth block arrangement pattern. The sixth block arrangement pattern shown in FIG. 18 is a block arrangement pattern in which the pixel region 113A is divided into two regions, first and second regions. In the sixth block arrangement pattern, the second region of the pixel region 113A is composed of blocks in (2m−1)th columns and in (4n−1)th rows and blocks in (2m)th columns and in (4n−3)th rows, and the first region thereof is composed of blocks other than the blocks in the second region. As used herein, m and n are positive integers (m=1, 2, 3, etc.; n=1, 2, 3, etc.). In this arrangement pattern, the ratio between the areas of the first and second regions is 3:1.

In step S22 of FIG. 10, if the division unit 71 determines that the image capture mode selected by the user is the second moving image mode, it sets first and second regions in accordance with the fifth block arrangement pattern shown in FIG. 17 or the sixth block arrangement pattern shown in FIG. 18. If the division unit 71 determines that the main subject is a non-moving subject, on the basis of the detection result from the detection unit 32A, it sets first and second regions in accordance with the sixth block arrangement pattern shown in FIG. 18. If the division unit 71 determines that the main subject is a moving subject and the moving direction of the moving subject is mostly vertical, on the basis of the detection result from the detection unit 32A, it sets first and second regions in accordance with the fifth block arrangement pattern shown in FIG. 17.

Then, in step S14, the drive control unit 72 outputs an instruction signal to the drive unit 21 so as to cause the drive unit 21 to capture a still image in the first region and moving images in the second region. If the first and second regions are set in accordance with the fifth block arrangement pattern, the number of pixels in a still image is twice the number of pixels in a moving image. That is, the resolution of a still image is twice as high as that of a moving image. If the first and second regions are set in accordance with the sixth block arrangement pattern, the number of pixels of a still image is three times the number of pixels of a moving image. That is, the resolution of a still image is three times as high as that of a moving image. This is because a still image is required to have finer image quality than a moving image. Further, in moving images, the subject is mostly moving and therefore a reduction in image quality is less remarkable than in a still image. For these reasons, more regions are assigned to a still image than to moving images. Assuming that the number of pixels in the pixel region 113A is 20 million pixels, even when the number of pixels of moving images (the number of pixels in the second region) is reduced to ⅓ or ¼, 6.66 million or 5 million pixels is ensured. Such a pixel number is comparable to the pixel number of a commercially available video camera.

Second Embodiment

In the first embodiment, as shown in FIG. 12(B), the image sensor 100 starts to capture images in the first and second regions at different timings in the second still image mode. In a second embodiment, in a second still image mode, an image sensor 100 starts to capture images in first and second regions at the same timing, and the first region and second region have different exposure times (i.e., charge accumulation times).

Figure 19:
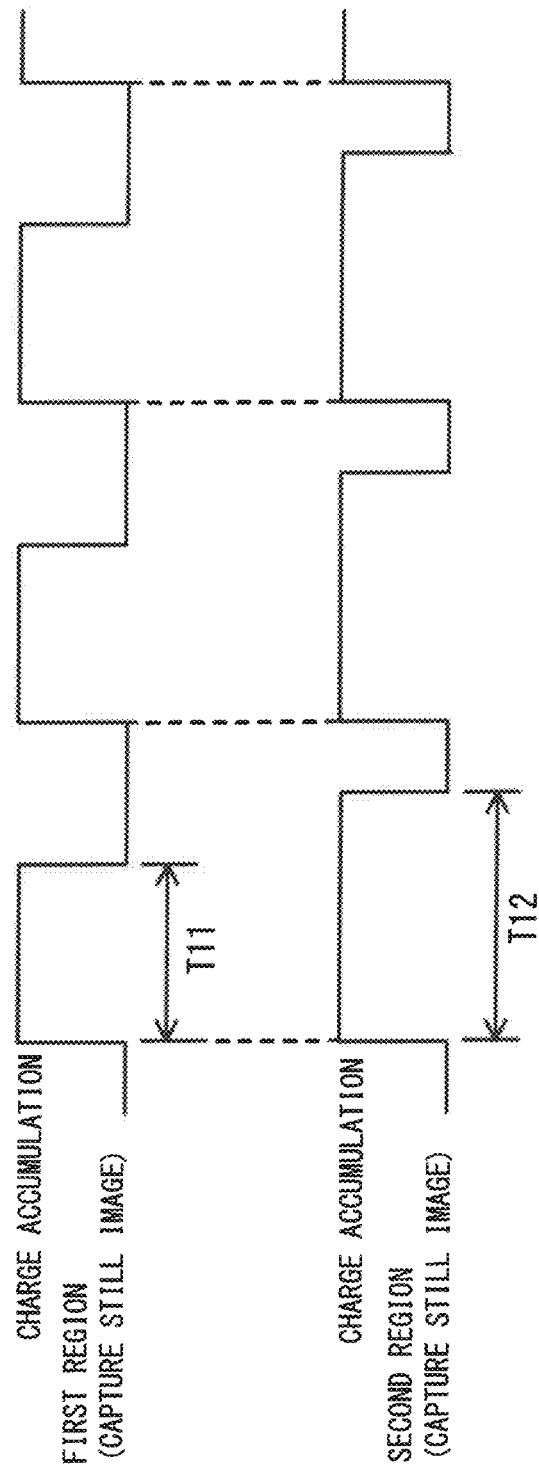
FIG. 19 is a timing chart showing charge accumulation timings in a second embodiment.

FIG. 19 is a timing chart showing charge accumulation timings in the second embodiment. In FIG. 19, first and second regions are set in the second still image mode. As shown in FIG. 19, while the user operates a release switch 55a, a drive unit 21 causes the image sensor 100 to repeatedly capture a still image in the first region by accumulating charge in the pixels of the first region for a charge accumulation time (exposure time) T11. Further, while the user operates the release switch 55a, the drive unit 21 causes the image sensor 100 to repeatedly capture a still image in the second region by accumulating charge in the pixels of the second region for a charge accumulation time (exposure time) T12. In this case, the image sensor 100 starts to capture images in the first and second regions at the same timing. On the other hand, the charge accumulation time T11 of the first region and the charge accumulation time T12 of the second region are different. Specifically, the charge accumulation time T12 is set to a time longer than the charge accumulation time T11. These charge accumulation times are set in the image capture condition setting process in step S23.

Pixel signals read from the pixels in the first region of the image sensor 100 are amplified by an amplifier 412 using a gain indicated by a division unit 71 and then outputted to an image processing unit 30. An image generation unit 31A identifies parameters used in image processing, such as color signal processing, on the basis of an instruction signal outputted from the division unit 71 and indicating the image capture conditions of the first region. The image generation unit 31A then generates first-region image data by performing various types of image processing on RAW data composed of the pixel signals from the pixels in the first region on the basis of the parameters.

Pixel signals read from the pixels in the second region of the image sensor 100 are amplified by the amplifier 412 using a gain indicated by the division unit 71 and then outputted to the image processing unit 30. The image generation unit 31B identifies parameters used in image processing, such as color signal processing, on the basis of an instruction signal outputted from the division unit 71 and indicating the image capture conditions of the second region. The image generation unit 31B then generates second-region image data by performing various types of image processing on RAW data composed of the pixel signals from the pixels in the second region on the basis of the parameters. Further, an image generation unit 31 (image combination unit 31A or 31B) combines the first-region image data and the second-region image data.

Figure 20:
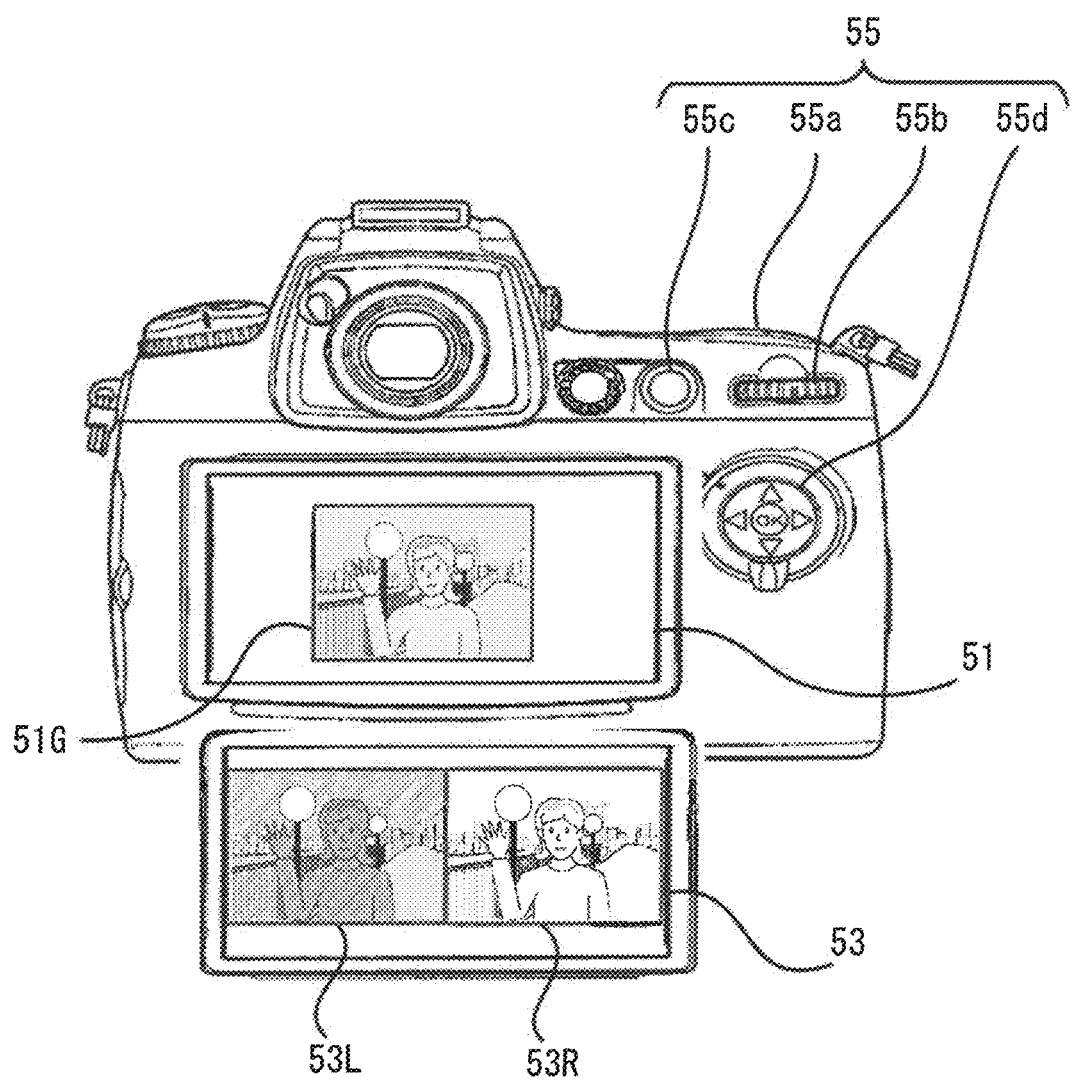
FIG. 20 is a drawing showing an example display in which still images are displayed on a first display unit and a second display unit according to the second embodiment.

FIG. 20 is a drawing showing an example display according to the second embodiment in which still images are displayed on a first display unit and a second display unit. In FIG. 20, a display control unit 73 (not shown) is displaying a still image (an image of a person captured at night) of the first region in a left region 53L of the display screen of a second display unit 53. The display control unit 73 is also displaying a still image of the second region in a right region 53R of the display screen of the second display unit 53. The display control unit 73 is also displaying, in a central region 51G of a first display unit 51, a still image obtained by combining the still image of the first region and the still image of the second region.

High-dynamic-range (HDR) imaging is widely known as a typical image combining technology for recording and displaying an image with a wide dynamic range. In HDR imaging, an image having less blown-out highlights or blocked-up shadows is generated by capturing multiple images while changing image capture conditions (e.g., exposure) and then combining the images. However, in conventional HDR, for example, two images are captured on different image capture conditions for different image capture times and therefore the subject may move or the user (operator) may move an electronic apparatus 1. In this case, the two images are not images of the same subject and therefore are difficult to combine. In the second embodiment, on the other hand, two images can be captured on different image capture conditions at the same (or approximately the same) time. This configuration of the second embodiment can solve the problem with the conventional HDR imaging. Note that the user can select the HDR mode, for example, by operating a multi-selector 55d.

Third Embodiment

A configuration of a third embodiment is obtained by dividing the electronic apparatus 1 of the first embodiment into an image capture device 1A and an electronic apparatus 1B.

Figure 21:
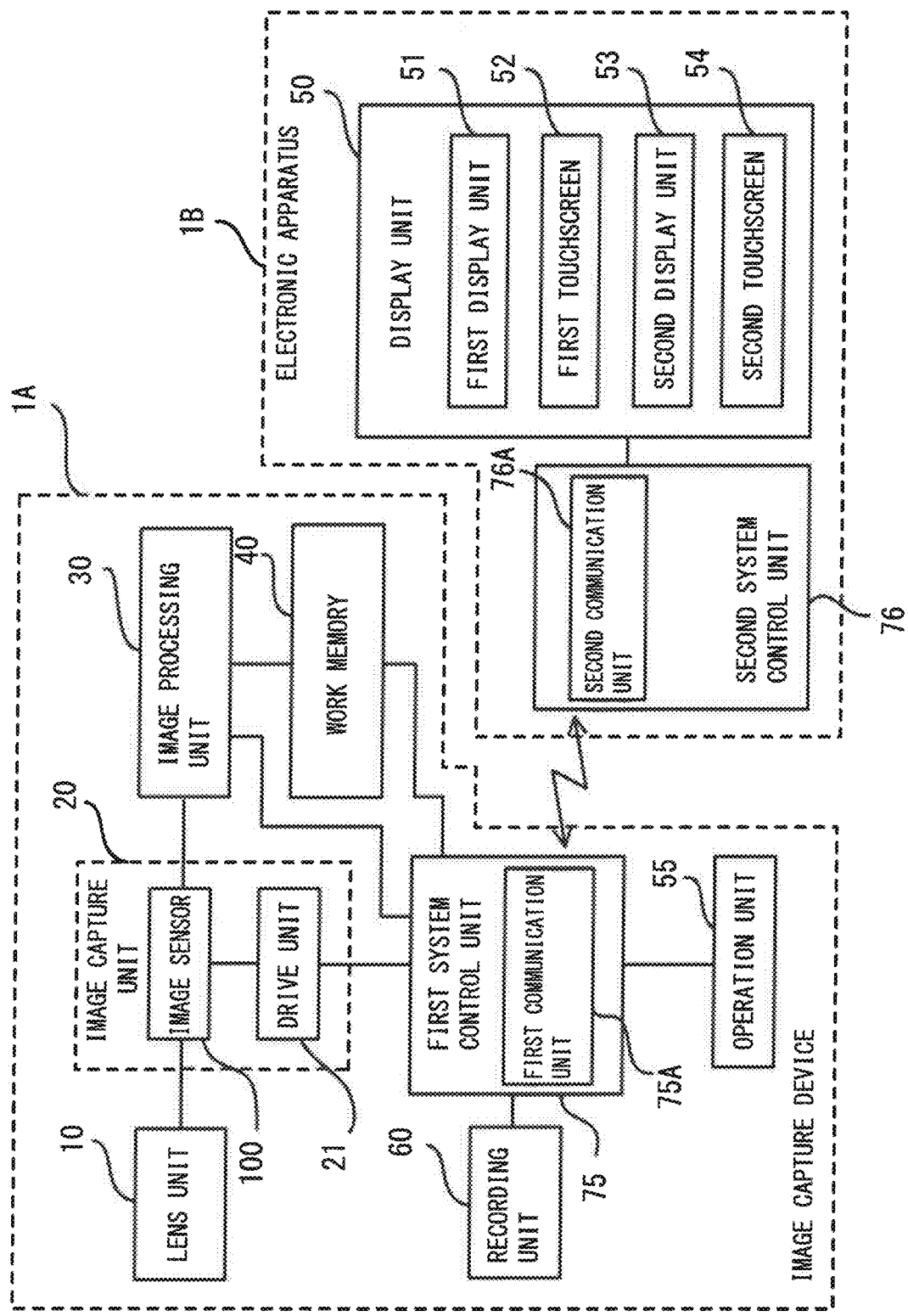
FIG. 21 is a block diagram showing the configuration of an image capture device and an electronic apparatus according to a third embodiment.

FIG. 21 is a block diagram showing the configuration of the image capture device and electronic apparatus according to the third embodiment. In the configuration shown in FIG. 21, the image capture device 1A captures images of subjects. The image capture device 1A includes a lens unit 10, an image capture unit 20, an image processing unit 30, a work memory 40, an operation unit 55, a recording unit 60, and a first system control unit 75. The 10, image capture unit 20, image processing unit 30, work memory 40, operation unit 55, and recording unit 60 of the image capture device 1A are similar to those shown in FIG. 5. Accordingly, the same elements are given the same reference signs and will not be described repeatedly.

The electronic apparatus 1B displays images (still images, moving images, live view images). The electronic apparatus 1B includes a display unit 50 and a second system control unit (control unit) 70B. The display unit 50 of the electronic apparatus 1B is similar to that shown in FIG. 5. Accordingly, the same elements are given the same reference signs and will not be described repeatedly.

The first system control unit 75 includes a first communication unit 75A. The second system control unit 76 includes a second communication unit 76B. The first communication unit 75A and second communication unit 76B transmit and receive signals to and from each other by wire or wirelessly. The first system control unit 75 includes, for example, elements equivalent to the division unit 71 and drive control unit 72 of the elements shown in FIG. 7. The second system control unit 76 includes, for example, only an element equivalent to the display control unit 73 of the elements shown in FIG. 7.

The elements shown in FIG. 7 (division unit 71, drive control unit 72, and display control unit 73) may be disposed in any of the first system control unit 75 and second system control unit 76. Specifically, all the elements shown in FIG. 7 may be disposed in one of the first system control unit 75 and second system control unit 76, or some of the elements shown in FIG. 7 may be disposed in the first system control unit 75, and the other elements may be disposed in the second system control unit 76.

Examples of the image capture device 1A include digital cameras, smartphones, mobile phones, and personal computers which each have image capture and communication functions. Examples of the electronic apparatus 1B include smartphones, mobile phones, and portable personal computers which each have a communication function.

The first system control unit 75 shown in FIG. 21 is implemented when a CPU (not shown) performs processing on the basis of a control program. The second system control unit 76 shown in FIG. 21 is implemented when a CPU (not shown) performs processing on the basis of a control program.

In the configuration shown in FIG. 21, the image processing unit 30 and first system control unit 75 may be formed integrally with each other. In this case, the functions of the image processing unit 30 and first system control unit 75 are implemented when a system control unit including one or more CPUs performs processing on the basis of a control program.

While the present invention has been described using the embodiments, the technical scope of the invention is not limited to the scope described in the embodiments. Various changes or modifications can be made to the embodiments without departing from the spirit and scope of the invention. Further, one or more of the elements described in the embodiments may be omitted. Any forms resulting from such changes, modifications, or omission are included in the technical scope of the invention. Any elements of the embodiments or modifications thereof may be combined as appropriate and used.

For example, in the first and second embodiments, the electronic apparatus 1 need not include the lens unit 10, recording unit 60, or the like, as long as it includes the image capture unit 20, the image processing unit 30 including the image generation unit 31, and the system control unit 70 including the division unit 71 and drive control unit 72. That is, these elements may be elements independent of the electronic apparatus 1. Also, in the third embodiment, the lens unit 10, recording unit 60, or the like may be an element independent of the image capture device 1A.

While the color filters 102 form a Bayer array in the embodiments, they may form other types of arrays. Each unit group 131 only has to include at least one pixel. Each block also only has to include at least one pixel. Accordingly, it is possible to capture images on image capture conditions which vary among the pixels.

In the embodiments, part or all of the drive unit 21 may be included in the image capture chip 113 or signal processing chip 111. Part of the image processing unit 30 may be included in the image capture chip 113 or signal processing chip 111. Part of the system control unit 70 may be included in the image capture chip 113 or signal processing chip 111.

While, in the embodiments, the gain, charge accumulation time (exposure time, shutter speed), and frame rate serving as image capture conditions are all variable, at least one of these only has to be variable. While only the case in which the image capture conditions are set automatically has been described, the imaging conditions may be set in response to the user operating the operation unit 55 or the like.

While the block arrangement patterns of the embodiments are exemplified in FIGS. 8(A) to 8(D), 17, and 18, other block arrangement patterns may be employed. Further, the user may select among the block arrangement patterns by operating the operation unit 55 or the like. A still image or moving images captured by the image capture unit 20 may be displayed on any of the first display unit 51 and the second display unit 53. While the case in which the sizes of the block regions are previously set has been described in the embodiments, the user may set the sizes of the block regions.

In the first embodiment, the division unit 71 recognizes subjects on the basis of live view images and then sets regions. Alternatively, the division unit 71 may recognize subjects on the basis of an image with respect to which the user has just pressed the release switch 55a or moving image switch 55c halfway and then may set regions.

In the first embodiment, an image capture mode for panning may be provided. Panning is an image capture method for representing the sense of speed of a moving subject due to non-fluctuation of the moving subject and fluctuation of the background (non-moving subjects). In the panning image capture mode, a panning image whose charge accumulation time (exposure time) is long and in which the background is streaking is captured in the first region, and a typical panning image whose charge accumulation time is shorter than that of the first region is captured in the second region. The image generation unit 31 (or user) combines the panning image in the first region and the panning image in the second region as appropriate.

DESCRIPTION OF REFERENCE SIGNS 1,1B . . . electronic apparatus, 1A . . . image capture device, 20 . . . image capture unit, 30 . . . image processing unit, 31,31A, 31B . . . image generation unit, 32A . . . detection unit, 50 . . . display unit, 51 . . . first display unit, 52 . . . first touchscreen, 53 . . . second display unit, 54 . . . second touchscreen, 70 . . . system control unit, 70A . . . first system control unit, 70B . . . second system control unit (control unit), 71 . . . division unit, 72 . . . drive control unit, 73 . . . display control unit, 100 . . . image sensor

The invention claimed is:

1. An electronic apparatus comprising:
an imaging sensor including:
a plurality of first pixels each including a first photoelectric converter that converts light into charge and outputting a first signal based on the charge resulting from conversion by the first photoelectric converter;
a plurality of second pixels each including a second photoelectric converter that converts light into charge and outputting a second signal based on the charge resulting from conversion by the second photoelectric converter;
a first control line that is connected to the first pixels and receives a first control signal for controlling the first pixels; and
a second control line that is connected to the second pixels and receives a second control signal for controlling the second pixels; and
a generator that generates first image data based on the first signal and generates second image data based on the second signal, wherein
the first photoelectric converters are arrayed in a first direction and a second direction crossing the first direction in a first region that light enters, and
the second photoelectric converters are arrayed in the first direction and the second direction in a second region that light enters.

2. The electronic apparatus of claim 1, wherein
the imaging sensor includes an image processor that processes the first signal and the second signal, and
the generator generates the first image data based on the first signal processed by the image processor and generates the second image data based on the second signal processed by the image processor.

3. The electronic apparatus of claim 2, wherein
the image processor includes an amplifier that amplifies the first signal and the second signal, and
the generator generates the first image data based on the first signal amplified by the amplifier and generates the second image data based on the second signal amplified by the amplifier.

4. The electronic apparatus of claim 3, wherein
the image processor includes a converter used for converting the first signal and the second signal into respective digital signals, and
the generator generates the first image data based on the first signal converted into the digital signal using the converter and generates the second image data based on the second signal converted into the digital signal using the converter.

5. The electronic apparatus of claim 4, wherein the imaging sensor includes a first semiconductor chip on which the first photoelectric converters and the second photoelectric converters are disposed and a second semiconductor chip on which the converter is disposed, the second semiconductor chip differing from the first semiconductor chip.

6. The electronic apparatus of claim 5, wherein the first semiconductor chip is stacked on the second semiconductor chip.

7. The electronic apparatus of claim 4, wherein
the imaging sensor includes a storage that stores the first signal converted into the digital signal using the converter and stores the second signal converted into the digital signal using the converter, and
the generator generates the first image data based on the first signal stored in the storage and generates the second image data based on the second signal stored in the storage.

8. The electronic apparatus of claim 7, wherein the imaging sensor includes a first semiconductor chip on which the first photoelectric converters and the second photoelectric converters are disposed, a second semiconductor chip on which the converter is disposed, the second semiconductor chip differing from the first semiconductor chip, and a third semiconductor chip on which the storage is disposed, the third semiconductor chip differing from the first semiconductor chip and the second semiconductor chip.

9. The electronic apparatus of claim 8, wherein the first semiconductor chip is stacked on the third semiconductor chip.

10. The electronic apparatus of claim 2, wherein
the image processor includes a first signal processing circuit that processes the first signal and a second signal processing circuit that processes the second signal, and
the generator generates the first image data based on the first signal processed by the first signal processing circuit and generates the second image data based on the second signal processed by the second signal processing circuit.

11. The electronic apparatus of claim 10, wherein
the first signal processing circuit includes a first amplifier circuit that amplifies the first signal,
the second signal processing circuit includes a second amplifier circuit that amplifies the second signal, and
the generator generates the first image data based on the first signal amplified by the first amplifier circuit and generates the second image data based on the second signal amplified by the second amplifier circuit.

12. The electronic apparatus of claim 10, wherein
the first signal processing circuit includes a first converter circuit used for converting the first signal into a digital signal,
the second signal processing circuit includes a second converter circuit used for converting the second signal into a digital signal, and
the generator generates the first image data based on the first signal converted into the digital signal using the first converter circuit and generates the second image data based on the second signal converted into the digital signal using the second converter circuit.

13. The electronic apparatus of claim 12, wherein the imaging sensor includes a first semiconductor chip on which the first photoelectric converters and the second photoelectric converters are disposed and a second semiconductor chip on which the first converter circuit and the second converter circuit are disposed, the second semiconductor chip differing from the first semiconductor chip.

14. The electronic apparatus of claim 13, wherein the first semiconductor chip is stacked on the second semiconductor chip.

15. The electronic apparatus of claim 12, wherein
the imaging sensor includes a first storage circuit that stores the first signal converted into the digital signal using the first converter circuit and a second storage circuit that stores the second signal converted into the digital signal using the second converter circuit, and
the generator generates the first image data based on the first signal stored in the first storage circuit and generates the second image data based on the second signal stored in the first storage circuit.

16. The electronic apparatus of claim 15, wherein the imaging sensor includes a first semiconductor chip on which the first photoelectric converters and the second photoelectric converters are disposed, a second semiconductor chip on which the first converter circuit and the second converter circuit are disposed, the second semiconductor chip differing from the first semiconductor chip, and a third semiconductor chip on which the first storage circuit and the second storage circuit are disposed, the third semiconductor chip differing from the first semiconductor chip and the second semiconductor chip.

17. The electronic apparatus of claim 16, wherein the first semiconductor chip is stacked on the third semiconductor chip.

18. The electronic apparatus of claim 1, wherein
the first pixels each include a first circuit connected to the first control line, and
the second pixels each include a second circuit connected to the second control line.

19. The electronic apparatus of claim 18, wherein
the first circuit includes a first transferer that transfers the charge from the corresponding first photoelectric converter in response to the first control signal, and
the second circuit includes a second transferer that transfers the charge from the corresponding second photoelectric converter in response to the second control signal.

20. The electronic apparatus of claim 1, wherein the second control signal is output to the second control line at a time point different from a time point at which the first control signal is output to the first control line.

21. The electronic apparatus of claim 18, wherein
the imaging sensor includes a third control line that is connected to the first pixels and receives a third control signal for controlling the first pixels and a fourth control line that is connected to the second pixels and receives a fourth control signal for controlling the second pixels, the fourth control line differing from the third control line, the first circuit includes a first resetter that is connected to the third control line and resets a potential of a first floating diffusion to which the charge is transferred from the corresponding first photoelectric converter in response to the third control signal, and the second circuit includes a second resetter that is connected to the fourth control line and resets a potential of a second floating diffusion to which the charge is transferred from the corresponding second photoelectric converter in response to the fourth control signal.

22. The electronic apparatus of claim 21, wherein the fourth control signal is output to the fourth control line at a time point different from a time point at which the third control signal is output to the third control line.

23. The electronic apparatus of claim 18, wherein the first circuit includes a first resetter that resets a potential of a first floating diffusion to which the charge is transferred from the corresponding first photoelectric converter in response to the first control signal, and the second circuit includes a second resetter that resets a potential of a second floating diffusion to which the charge is transferred from the corresponding second photoelectric converter in response to the second control signal.

24. The electronic apparatus of claim 23, wherein the second control signal is output to the second control line at a time point different from a time point at which the first control signal is output to the first control line.

25. The electronic apparatus of claim 1, wherein the second region is located further in the first direction relative to the first region.

26. The electronic apparatus of claim 25, wherein the second region is located further in the second direction relative to the first region.

27. The electronic apparatus of claim 1, wherein the imaging sensor includes a first output line that is connected to the first pixels and receives the first signal and a second output line that is connected to the second pixels and receives the second signal, the second output line differing from the first output line.

28. The electronic apparatus of claim 27, wherein the imaging sensor includes a first current source circuit that is connected to the first output line and supplies current to the first output line and a second current source circuit that is connected to the second output line and supplies current to the second output line.

29. The electronic apparatus of claim 27, wherein the first output line is connected to the first pixels, and the second output line is connected to the second pixels.

30. An electronic apparatus comprising:

an imaging sensor including:

a plurality of pixels;

a first control line connected to a plurality of first pixels, included in the pixels, the first pixels each including a first photoelectric converter that converts light into charge and outputting a first signal based on the charge resulting from conversion by the first photoelectric converter, the first control line receiving a first control signal for controlling the first pixels; and a second control line connected to a plurality of second pixels, included in the pixels, the second pixels each including a second photoelectric converter that converts light into charge and outputting a second signal based on the charge resulting from conversion by the second photoelectric converter, the second control line receiving a second control signal for controlling the second pixels; and a generator that generates first image data based on the first signal and generates second image data based on the second signal, wherein the first photoelectric converters are arrayed in a first direction and a second direction crossing the first direction in a first region that light enters, and the second photoelectric converters are arrayed in the first direction and the second direction in a second region that light enters.

31. The electronic apparatus of claim 30, wherein the imaging sensor includes an image processor that processes the first signal and the second signal, and the generator generates the first image data based on the first signal processed by the image processor and generates the second image data based on the second signal processed by the image processor.

32. The electronic apparatus of claim 31, wherein the image processor includes an amplifier that amplifies the first signal and the second signal, and the generator generates the first image data based on the first signal amplified by the amplifier and generates the second image data based on the second signal amplified by the amplifier.

33. The electronic apparatus of claim 32, wherein the image processor includes a converter used for converting the first signal and the second signal into respective digital signals, and the generator generates the first image data based on the first signal converted into the digital signal using the converter and generates the second image data based on the second signal converted into the digital signal using the converter.

34. The electronic apparatus of claim 33, wherein the imaging sensor includes a first semiconductor chip on which the first photoelectric converters and the second photoelectric converters are disposed and a second semiconductor chip on which the converter is disposed, the second semiconductor chip differing from the first semiconductor chip.

35. The electronic apparatus of claim 34, wherein the first semiconductor chip is stacked on the second semiconductor chip.

36. The electronic apparatus of claim 33, wherein the imaging sensor includes a storage that stores the first signal converted into the digital signal using the converter and stores the second signal converted into the digital signal using the converter, and the generator generates the first image data based on the first signal stored in the storage and generates the second image data based on the second signal stored in the storage.

37. The electronic apparatus of claim 36, wherein the imaging sensor includes a first semiconductor chip on which the first photoelectric converters and the second photoelectric converters are disposed, a second semiconductor chip on which the converter is disposed, the second semiconductor chip differing from the first semiconductor chip, and a third semiconductor chip on which the storage is disposed, the third semiconductor chip differing from the first semiconductor chip and the second semiconductor chip.

38. The electronic apparatus of claim 37, wherein the first semiconductor chip is stacked on the third semiconductor chip.

39. The electronic apparatus of claim 31, wherein
the image processor includes a first signal processing circuit that processes the first signal and a second signal processing circuit that processes the second signal, and
the generator generates the first image data based on the first signal processed by the first signal processing circuit and generates the second image data based on the second signal processed by the second signal processing circuit.

40. The electronic apparatus of claim 39, wherein
the first signal processing circuit includes a first amplifier circuit that amplifies the first signal,
the second signal processing circuit includes a second amplifier circuit that amplifies the second signal, and
the generator generates the first image data based on the first signal amplified by the first amplifier circuit and generates the second image data based on the second signal amplified by the second amplifier circuit.

41. The electronic apparatus of claim 39, wherein
the first signal processing circuit includes a first converter circuit used for converting the first signal into a digital signal,
the second signal processing circuit includes a second converter circuit used for converting the second signal into a digital signal, and
the generator generates the first image data based on the first signal converted into the digital signal using the first converter circuit and generates the second image data based on the second signal converted into the digital signal using the second converter circuit.

42. The electronic apparatus of claim 41, wherein the imaging sensor includes a first semiconductor chip on which the first photoelectric converters and the second photoelectric converters are disposed and a second semiconductor chip on which the first converter circuit and the second converter circuit are disposed, the second semiconductor chip differing from the first semiconductor chip.

43. The electronic apparatus of claim 42, wherein the first semiconductor chip is stacked on the second semiconductor chip.

44. The electronic apparatus of claim 41, wherein
the imaging sensor includes a first storage circuit that stores the first signal converted into the digital signal using the first converter circuit and a second storage circuit that stores the second signal converted into the digital signal using the second converter circuit, and
the generator generates the first image data based on the first signal stored in the first storage circuit and generates the second image data based on the second signal stored in the second storage circuit.

45. The electronic apparatus of claim 44, wherein the imaging sensor includes a first semiconductor chip on which the first photoelectric converters and the second photoelectric converters are disposed, a second semiconductor chip on which the first converter circuit and the second converter circuit are disposed, the second semiconductor chip differing from the first semiconductor chip, and a third semiconductor chip on which the first storage circuit and the second storage circuit are disposed, the third semiconductor chip differing from the first semiconductor chip and the second semiconductor chip.

46. The electronic apparatus of claim 45, wherein the first semiconductor chip is stacked on the third semiconductor chip.

47. The electronic apparatus of claim 30, wherein
the first pixels each include a first circuit connected to the first control line, and
the second pixels each include a second circuit connected to the second control line.

48. The electronic apparatus of claim 47, wherein
the first circuit includes a first transferer that transfers the charge from the corresponding first photoelectric converter in response to the first control signal, and
the second circuit includes a second transferer that transfers the charge from the corresponding second photoelectric converter in response to the second control signal.

49. The electronic apparatus of claim 30, wherein the second control signal is output to the second control line at a time point different from a time point at which the first control signal is output to the first control line.

50. The electronic apparatus of claim 47, wherein
the imaging sensor includes a third control line that is connected to the first pixels and receives a third control signal for controlling the first pixels and a fourth control line that is connected to the second pixels and receives a fourth control signal for controlling the second pixels, the fourth control line differing from the third control line,
the first circuit includes a first resetter that is connected to the third control line and resets a potential of a first floating diffusion to which the charge is transferred from the corresponding first photoelectric converter in response to the third control signal, and
the second circuit includes a second resetter that is connected to the fourth control line and resets a potential of a second floating diffusion to which the charge is transferred from the corresponding second photoelectric converter in response to the fourth control signal.

51. The electronic apparatus of claim 50, wherein the fourth control signal is output to the fourth control line at a time point different from a time point at which the third control signal is output to the third control line.

52. The electronic apparatus of claim 47, wherein
the first circuit includes a first resetter that resets a potential of a first floating diffusion to which the charge is transferred from the corresponding first photoelectric converter in response to the first control signal, and
the second circuit includes a second resetter that resets a potential of a second floating diffusion to which the charge is transferred from the corresponding second photoelectric converter in response to the second control signal.

53. The electronic apparatus of claim 42, wherein the second control signal is output to the second control line at a time point different from a time point at which the first control signal is output to the first control line.

54. The electronic apparatus of claim 30, wherein the imaging sensor includes a first output line that is connected to the first pixels and receives the first signal and a second output line that is connected to the second pixels and receives the second signal, the second output line differing from the first output line.

55. The electronic apparatus of claim 54, wherein the imaging sensor includes a first current source circuit that is connected to the first output line and supplies current to the first output line and a second current source circuit that is connected to the second output line and supplies current to the second output line.

56. The electronic apparatus of claim 54, wherein the first output line is connected to the first pixels, and the second output line is connected to the second pixels.

\* \* \* \* \*